(12) United States Patent
Aotsuka

(10) Patent No.: US 7,030,916 B2
(45) Date of Patent: Apr. 18, 2006

(54) COLOR IMAGE PICKUP APPARATUS WITH LIGHT SOURCE DISTINGUISHING FUNCTION

(75) Inventor: Yasuo Aotsuka, Kurokawa-gun (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 753 days.

(21) Appl. No.: 10/244,425

(22) Filed: Sep. 17, 2002

(65) Prior Publication Data

US 2003/0058357 A1    Mar. 27, 2003

(30) Foreign Application Priority Data

Sep. 19, 2001 (JP) ............................. 2001-285403
Mar. 28, 2002 (JP) ............................. 2002-090427

(51) Int. Cl.
*H04N 9/83* (2006.01)
*H04N 9/73* (2006.01)

(52) U.S. Cl. ................. 348/272; 348/223.1; 348/226.1
(58) Field of Classification Search .................... None
See application file for complete search history.

(56) References Cited

U.S. PATENT DOCUMENTS 5,099,313 A * 3/1992 Suemoto et al. ......... 348/226.1
5,555,464 A * 9/1996 Hatlestad .................... 348/266
6,952,225 B1 * 10/2005 Hyodo et al. ............ 348/223.1

* cited by examiner

*Primary Examiner*—David Ometz
*Assistant Examiner*—Adam L. Henderson
(74) *Attorney, Agent, or Firm*—Arent Fox PLLC

(57) ABSTRACT

An image pickup system includes photodiodes with color filters. A first color filter group includes visual light color filters, and a second color filter group includes a long red color filter at 640 nm or longer or a color filter at 580 nm and one of the visual light color filters. An infrared cut filter covers all the filters. A control circuit includes a fluorescent lamp distinguishing circuit for distinguishing a fluorescent lamp from other illuminating light sources by a ratio of an output signal from the photodiode with the long red filter to an output signal from the photodiodes with the visual light color filters; and a white balance control circuit for adjusting a white balance so as to match the illuminating light source distinguished by the fluorescent lamp distinguishing circuit.

18 Claims, 15 Drawing Sheets

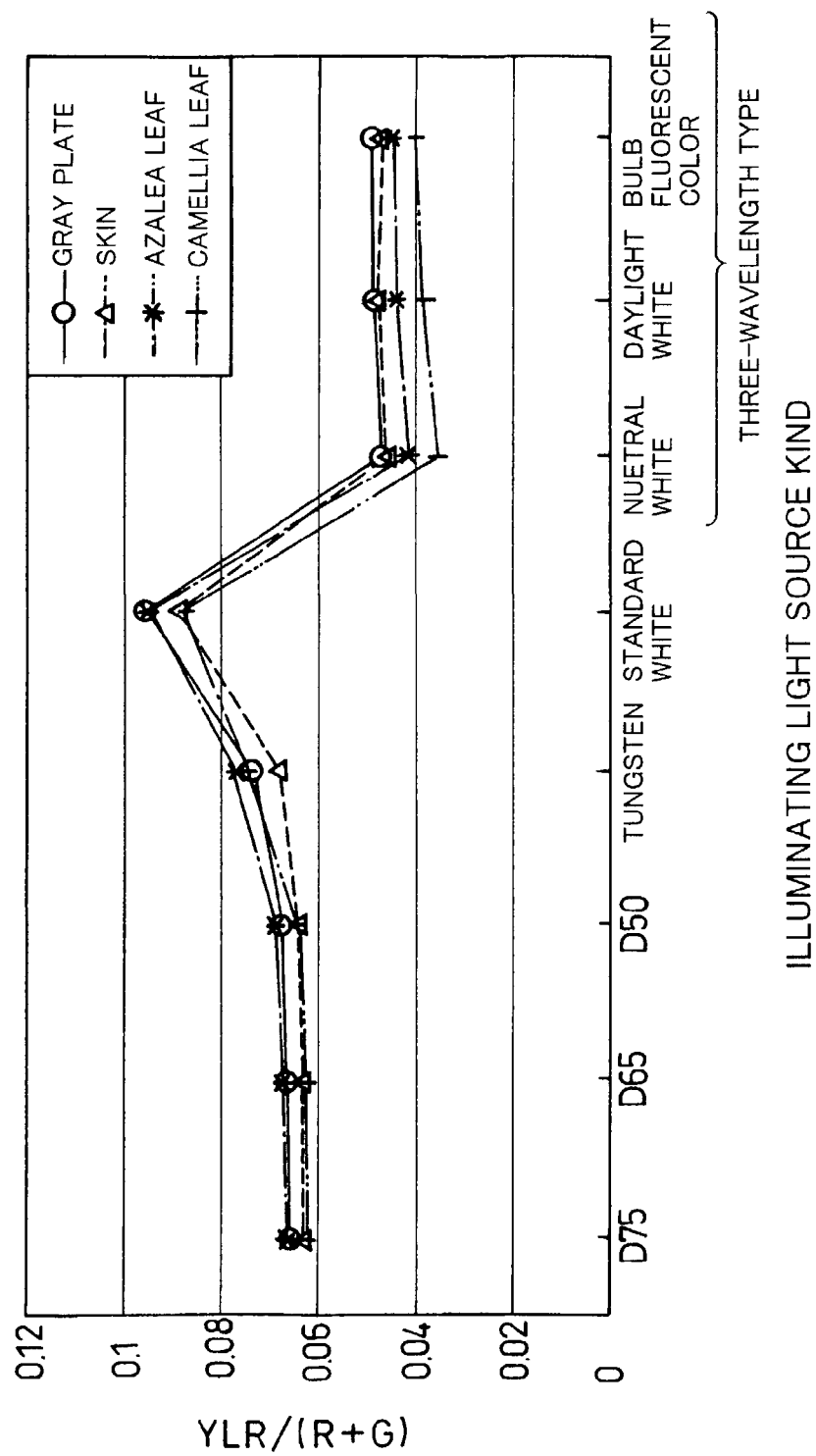

COLOR IMAGE PICKUP APPARATUS WITH LIGHT SOURCE DISTINGUISHING FUNCTION

CROSS REFERENCE TO RELATED APPLICATION

This application is based on Japanese Patent Application No. 2001-285403, filed on Sep. 19, 2001 and Japanese Patent Application No. 2002-090427, filed on Mar. 28, 2002, the entire contents of which are incorporated herein by reference.

BACKGROUND OF THE INVENTION

A) Field of the Invention

The present invention relates to a color image pickup apparatus and more particularly to a color image pickup apparatus capable of obtaining a good white balance independently from the kinds of illuminating light sources.

B) Description of the Related Art

Technical advance of digital still cameras and digital video cameras (hereinafter collectively called "digital camera") is remarkable. Most of digital cameras are equipped with an auto white balance (AWB) mechanism which distinguishes between different light sources and automatically adjusts a white balance.

Some digital cameras cannot correctly distinguish between different light sources. If distinguishment is impossible between sun light and fluorescent light, a photographed image has a large white imbalance.

According to prior art light source distinguishing technique, a primary color digital camera calculates R/G and B/G ratios of each pixel or a predetermined divided area of a photographing scene. The illuminating light source is estimated from a two-dimensional distribution of R/G and B/G ratios.

Estimation of an illuminating light source is made on the assumption that an average of a general photographing scene inclusive of a variety of photographing objects is gray, or on the assumption that an area of a photographing scene having a highest illumination is white.

In practice, however, there are many scenes to which the above-described assumptions cannot be applied. For example, a semi-dark scene full of green leaves under sun light is similar to a scene under a standard white fluorescent lamp, a daylight fluorescent lamp or a neutral white fluorescent lamp so that a light source distinguishing error is likely to occur. A high color rendering fluorescent lamp has the characteristics similar to those of sun light so that distinguishing between them is unnecessary. A bulb type fluorescent lamp can be easily distinguished by a prior art method.

Illuminating light sources to be paid attention are therefore a standard white fluorescent lamp, a three-wavelength daylight fluorescent lamp and a three-wavelength neutral white fluorescent lamp. In this specification, these fluorescent lamps are simply called fluorescent lamps unless otherwise specifically mentioned.

Recent digital cameras are of high quality and easy to use and are prevailing in general users in place of film cameras. There are many chances of taking scenes under various illuminating light sources with digital cameras. Good photographing is desired not only in sun light and tungsten light (incandescent lamp) but also in various kinds of fluorescent light.

Since a solid image pickup device of a digital camera has a narrow dynamic range, it is important to have a good white balance. If the white balance is poor, it is difficult to adjust the color of an image after it is taken. The auto white balance (AWB) function is therefore important because it automatically distinguishes the kind of an illuminating light source. It is not practical if a photographer manually sets a white balance by distinguishing the kind of each light source. The AWB function of a digital camera is essential in order to enjoy the usability compatible with a conventional silver salt compact camera.

It is important to improve a precision of an AWB function of a digital camera. Tungsten light can be distinguished by a conventional method at a high precision. It is desired to distinguish fluorescent light at a high precision.

SUMMARY OF THE INVENTION

An object of this invention is to distinguish fluorescent light as illuminating light source at high precision. If the illuminating light source can be distinguished, a proper white balance (WB) can be obtained and an image of a good quality can be taken. A proper WB can be obtained also for fluorescent light.

According to one aspect of the present invention, there is provided a color image pickup apparatus comprising an optical image pickup system and a signal processing system for processing a signal supplied from the optical image pickup system, wherein: the optical image pickup system comprises: a plurality of photoelectric conversion elements regularly disposed on a two-dimensional plane; a plurality of color filters each disposed on each of the photoelectric conversion elements, the color filters including first and second color filter groups, the first color filter group including visual light color filters of a plurality of colors to be used for obtaining digital color image signals, and the second color filter group including a long red color filter and at least one of the visual light color filters, the long red color filter having a transmission factor only in a wavelength range of substantially 640 nm or longer and being used for white color balance; an infrared cut filter disposed on the color filters; and a taking lens, and the signal processing system comprises a control circuit including: a fluorescent lamp distinguishing circuit for distinguishing a fluorescent lamp from other illuminating light sources in accordance with a ratio of an output signal from the photoelectric conversion element having the long red filter of the second color filter group to an output signal from the photoelectric conversion element having the visual light color filter; and a first white balance control circuit for adjusting a white balance so as to match the illuminating light source distinguished by the fluorescent lamp distinguishing circuit.

The color image pickup apparatus can distinguish between an illuminating light source such as fluorescent light having a relatively small radiation energy in the wavelength range of 640 nm or longer and an illuminating light source such as sun light and incandescent light having a relatively large radiation energy in the wavelength range of 640 nm or longer. It is possible to adjust white balance matching each illuminating light source.

According to another aspect of the present invention, there is provided a color image pickup apparatus comprising an optical image pickup system and a signal processing system for processing a signal supplied from the optical image pickup system, wherein: the optical image pickup system comprises: a plurality of photoelectric conversion elements regularly disposed on a two-dimensional plane; a plurality of color filters each disposed on each of the photoelectric conversion elements, the color filters including first and third color filter groups, the first color filter group including visual light color filters of a plurality of colors to be used for obtaining digital color image signals, and the third second color filter group including a yellow color filter and at least one of the visual light color filters, the yellow color filter having a transmission factor only in a wavelength range substantially from 555 nm to 605 nm longer and being used for white color balance; an infrared cut filter disposed on the color filters; and a taking lens, and the signal processing system comprises a control circuit including: a fluorescent lamp distinguishing circuit for distinguishing a standard white fluorescent lamp from other illuminating light sources in accordance with a ratio of an output signal from the photoelectric conversion element having the yellow color filter of the third color filter group to an output signal from the photoelectric conversion element having the visual light color filter; and a second white balance control circuit for adjusting a white balance so as to match the illuminating light source distinguished the fluorescent lamp distinguishing circuit.

The color image pickup apparatus can distinguish between standard white fluorescent light having a relatively large radiation energy in the wavelength range from 555 nm to 605 nm, and three-wavelength (or five-wavelength) fluorescent light, sun light, tungsten light, high color rendering fluorescent light and the like having a large peak in the wavelength range slightly shorter than 555 nm and the wavelength range slightly longer than 605 nm. It is possible to adjust white balance matching each illuminating light source.

The first, second or third color filter group may be overlapped. Namely, a visual light color filter (excepting LR filter and Y filter) in the second or third filter group may be used also as the visual light color filter of the first color filter group.

BRIEF DESCRIPTION OF THE DRAWINGS

FIG. 15 is a graph showing YLR/(R+G) values when a gray plate and an azalea leaf are taken under various illuminating light sources with the solid image pickup apparatus (digital camera) of the fourth embodiment.

DESCRIPTION OF THE PREFERRED EMBODIMENTS

Figure 1:
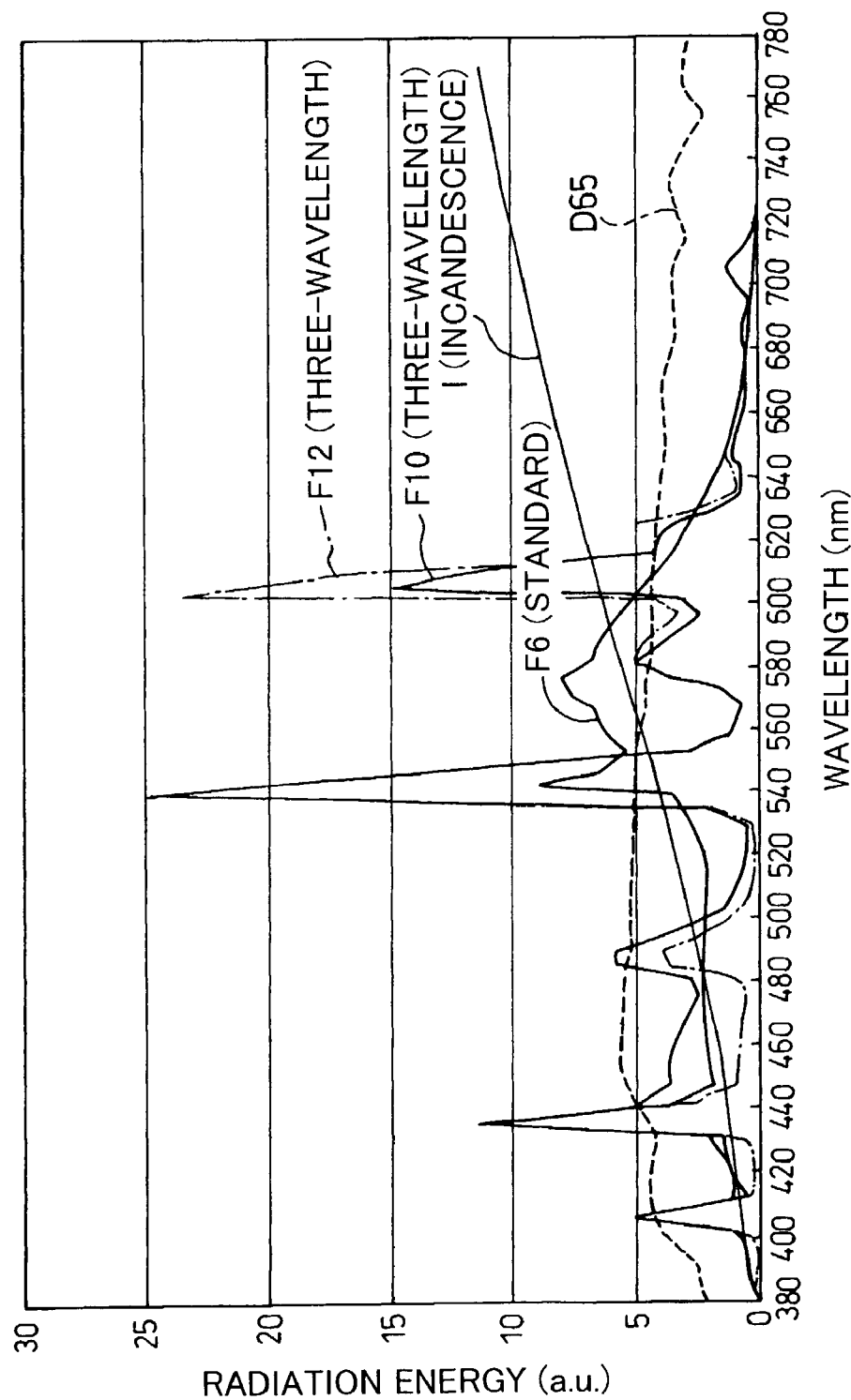
FIG. 1 is a spectrum diagram showing radiation energies of various light sources relative to a wavelength.

Studies made by the inventor will be described with reference to FIG. 1. FIG. 1 is a spectrum diagram showing a wavelength dependency of radiation energy of each of various light sources.

As shown in FIG. 1, sun light (D65) and tungsten light (incandescent lamp 1) contain long red light and infrared light having a wavelength longer than red light. Fluorescent light (F6, F10 and F12) hardly contains long red light and infrared light. Fluorescent light has small radiation in the wavelength range of 640 nm or longer and has almost no radiation in the wavelength range of 750 nm or longer.

Radiation energies of a standard white fluorescent lamp (F6), a three-wavelength daylight fluorescent lamp, a three-wavelength neutral white fluorescent lamp (F10) and a three-wavelength bulb type fluorescent lamp (F12) which are difficult to be distinguished from sun light by a conventional AWB algorithm reduces abruptly near at 640 nm.

If an optical sensor having a sensitivity substantially only in the range of 640 nm or longer is mounted on a digital camera and the radiation energy of a wavelength of 640 nm or longer is measured for each scene, it is possible to correctly distinguish between light sources of the fluorescent lamps described above and other light sources.

An infrared sensor is already used as an optical sensor capable of detecting an infrared light quantity. This sensor is also used as a temperature sensor of an electronic kitchen range. It is not preferable to mount an infrared sensor on a digital camera, because an additional mount space is necessary and the cost rises.

Preliminary exposure may be performed by not forming an IR cut filter of cutting infrared light and obtaining RGB spectral sensitivities in the illuminating light source monitoring area of a CCD photoelectric conversion device or by using a movable IR cut filer which is moved to the monitoring area during preliminary exposure. These methods complicate the structure of a digital camera and the manufacture cost rises.

The inventor has paid attention to that an Si solid image pickup device, e.g., a CCD solid image pickup device of a digital camera, has a sensitivity in the wavelength range of long red light. This CCD solid image pickup device is effectively used for light source distinguishment without complicating the camera structure.

Basing upon the above-described studies, a solid image pickup device according to the first embodiment of the invention will be described with reference to FIGS. 2 to 9.

Figure 2:
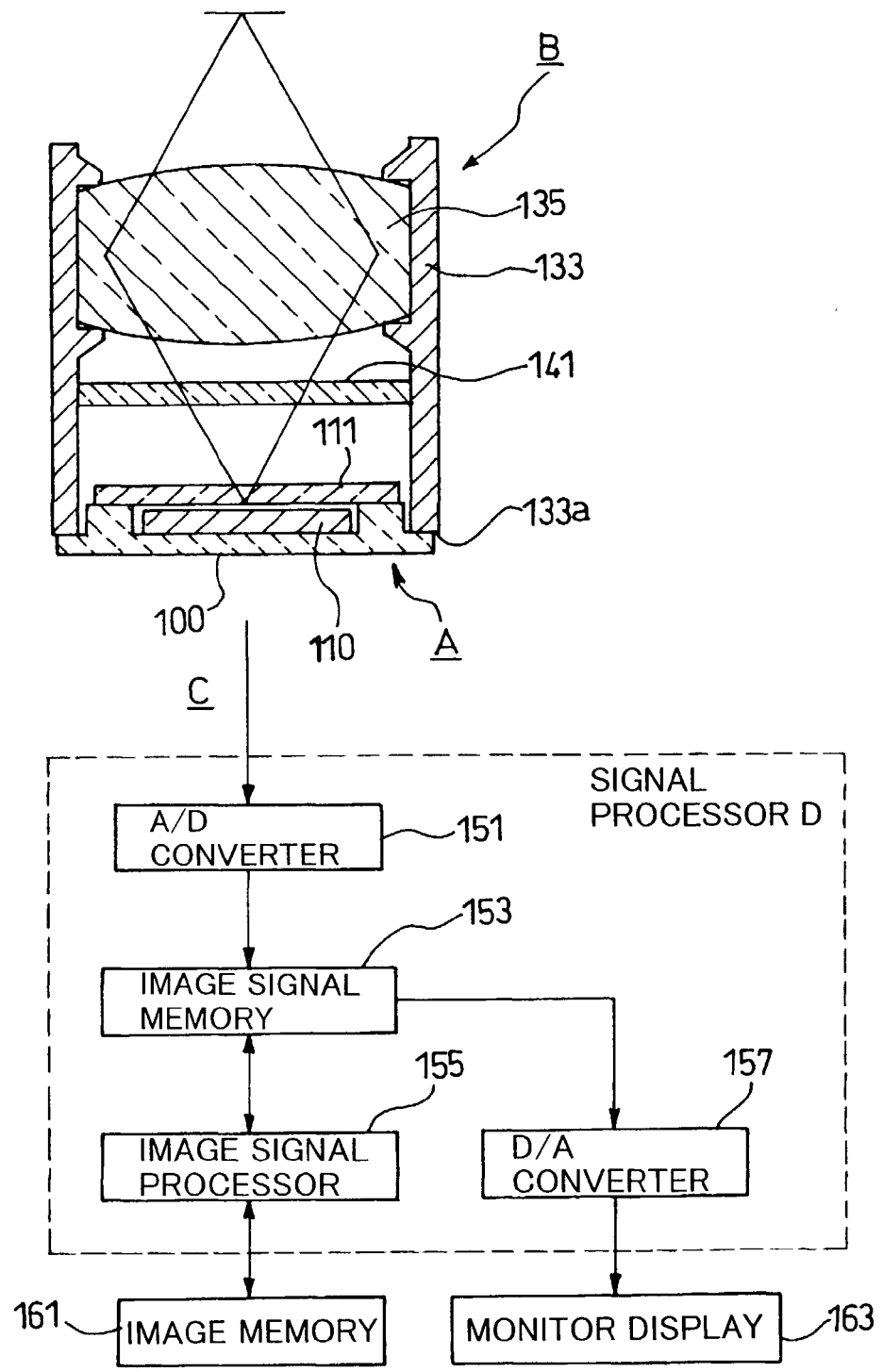
FIG. 2 is a schematic diagram showing the outline structure of an image pickup apparatus according to a first embodiment of the invention.

FIG. 2 is a schematic diagram showing the outline structure of a color image pickup apparatus (digital still camera) of the embodiment. The color image pickup apparatus C has an image pickup unit B, a signal processor D, an image memory (storage device) 161, and a monitor display 163. An infrared cut filter 141 is disposed between a taking lens 135 and a sealing plate 111. The sealing plate 111 is made of, for example, a crystal plate cut to have a special orientation, and functions also as a low pass filter.

Figure 5:
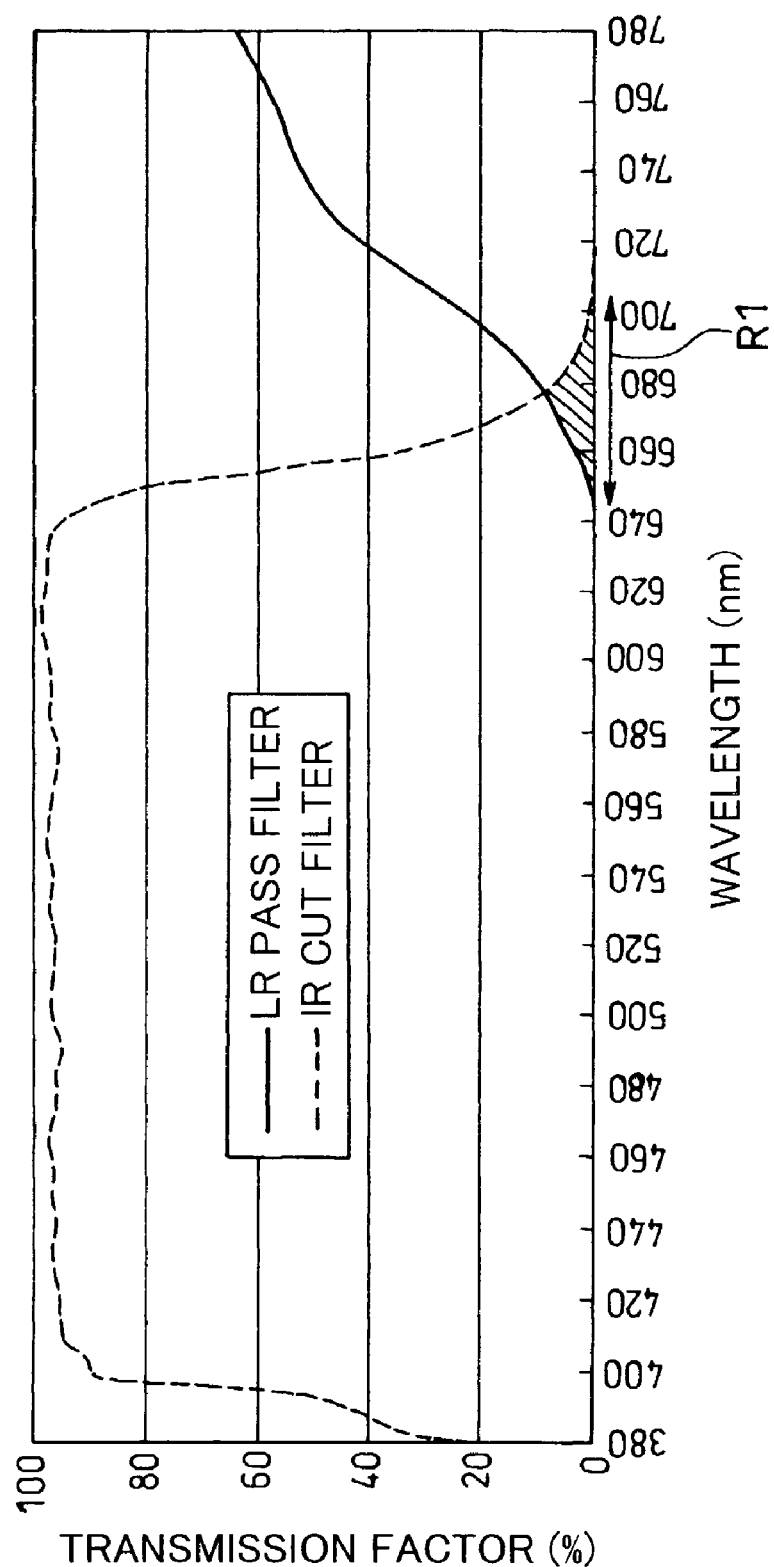
FIG. 5 is a spectrum diagram showing transmission factors of an infrared (IR) cut filter and a long red (LR) filter relative to a wavelength.

FIG. 5 is a diagram showing the wavelength dependency of transmission factors of an IR (infrared) cut filter and an LR (long red) pass filter of this embodiment. The IR cut filter 141 lowers the transmission factor at the wavelength of 655 nm or longer (at which the transmission factor is 50%). The transmission factor in the wavelength range from 640 nm to 655 nm is 50% or higher.

A CCD solid image pickup device 110 is housed in a chip carrier 100. The chip carrier 100 is sealed with the sealing plate 111. Image signals picked up with the image pickup unit B are processed by the signal processor D.

For example, the signal processor D has: an A/D converter 151 for converting an analog signal into a digital signal; an image signal memory 153 for storing digital signals converted by the A/D converter 151; an image signal processor (microprocessor) 155 for processing digital signals stored in the image signal memory 153; and a D/A converter 157 for converting a digital signal stored in the image signal memory 153 into an analog signal. The image signal processor 155 also performs a color difference matrix calculation.

The image memory 161 is, for example, a nonvolatile semiconductor memory such as a flash memory. The image memory 161 can store images and is used when images are reproduced at another digital still camera.

The monitor display 163 is, for example, a liquid crystal display and can reproduce a visual image from image signals. The monitor display 163 may be used as a moving image monitor of the digital still camera.

The structure of a solid image pickup device will be described by using as an example a CCD solid state image pickup device.

Figure 3:
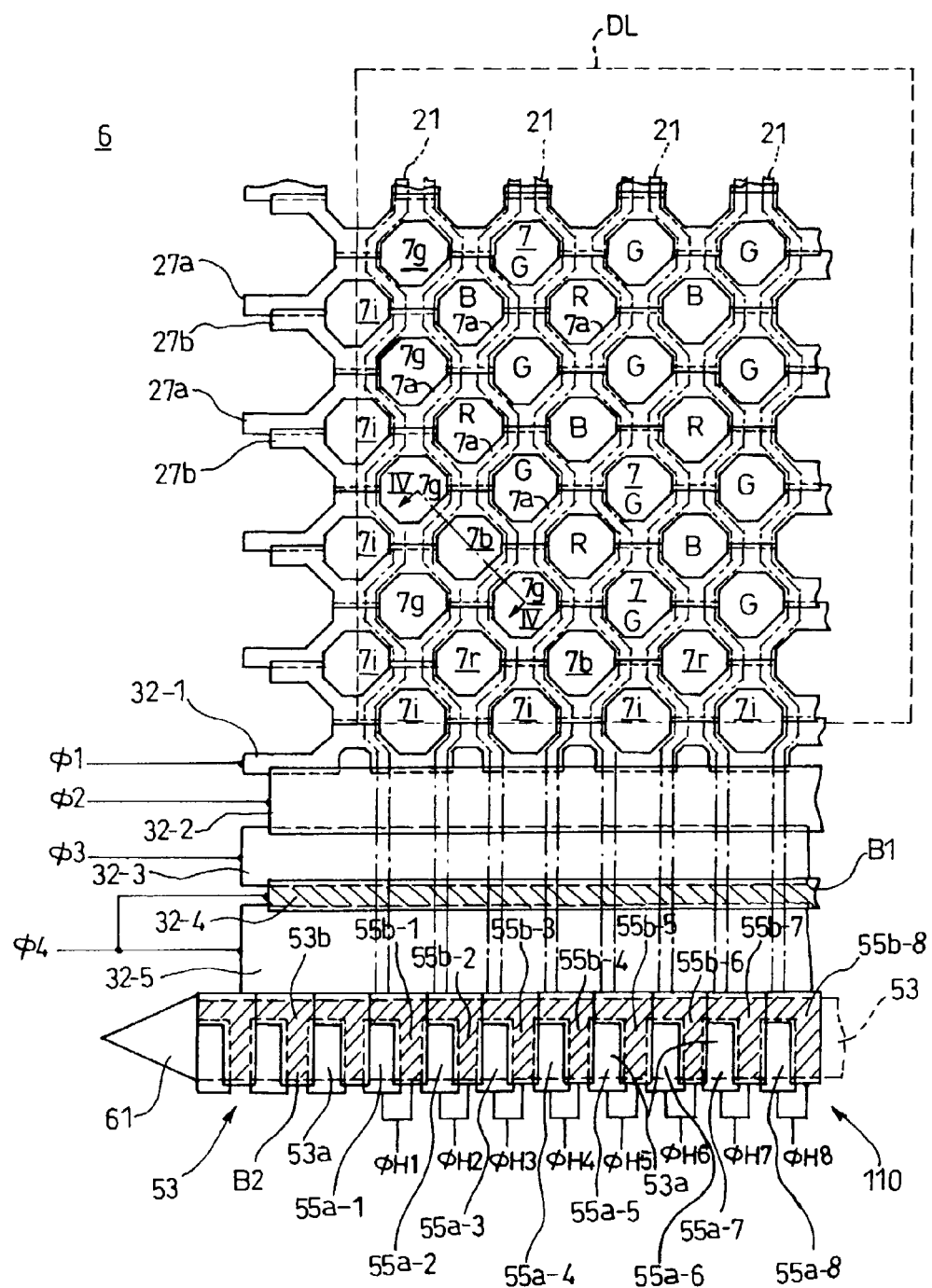
FIG. 3 is a plan view showing a CCD solid state image pickup device shown in FIG. 2.
Figure 4A:
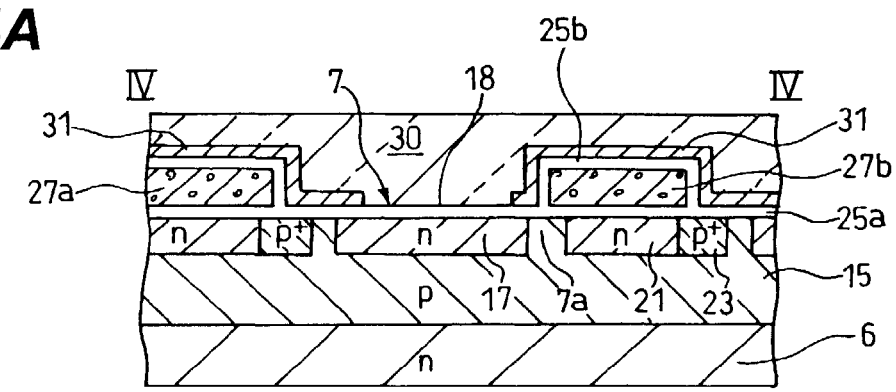
FIGS. 4A to 4C are cross sectional views illustrating manufacture processes of a CCD solid state image pickup device, mainly color filter forming processes.
Figure 4B:
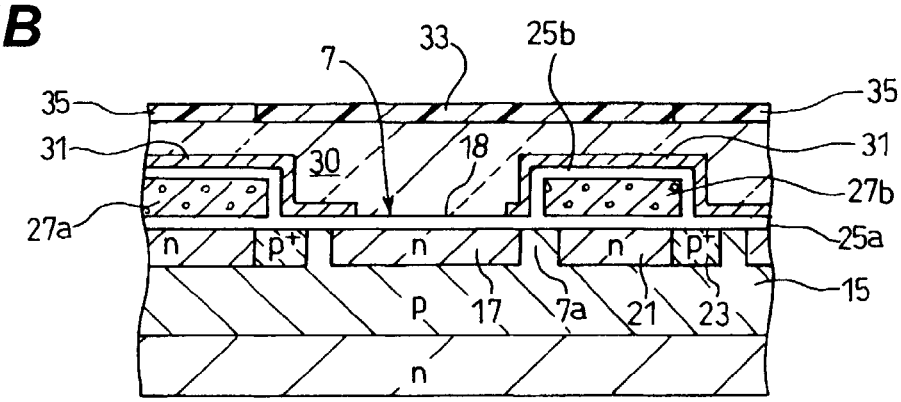
Figure 4C:
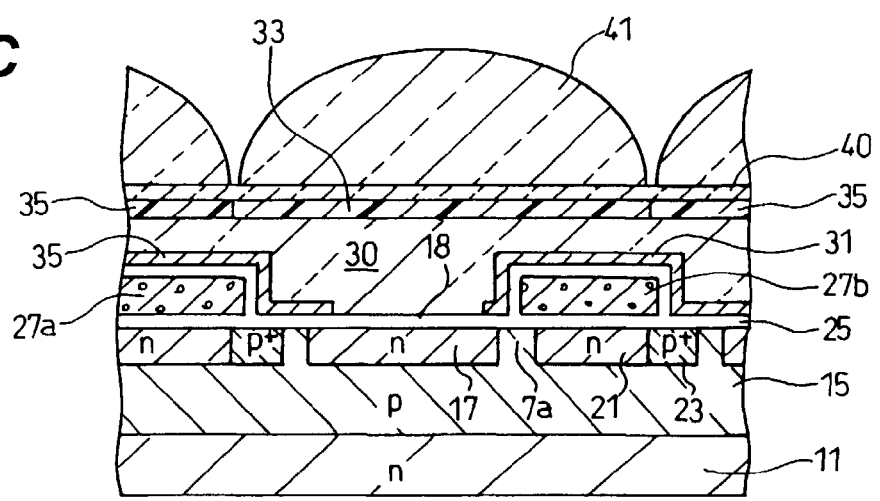

FIG. 3 is a plan view of a honeycomb CCD color image pickup device which is one example of the CCD solid state image pickup device. FIGS. 4A to 4C are cross sectional views illustrating the manufacture processes for a honeycomb CCD color image pickup device.

As shown in FIG. 3, a honeycomb CCD color image pickup device 110 has a number of photoelectric conversion elements 7 disposed along columns and rows at a constant pitch on a two-dimensional surface of a semiconductor substrate 6. A photoelectric conversion element column is constituted of photoelectric conversion elements 7 disposed along a column direction, and a photoelectric conversion element row is constituted of photoelectric conversion elements 7 disposed along a row direction. A read gate 7a for reading charges is formed adjacent to each photoelectric conversion element 7.

Each of the photoelectric conversion elements constituting one photoelectric conversion column is shifted by about a half pitch along the column direction relative to the photoelectric conversion elements constituting another photoelectric conversion column adjacent along the row direction to the one photoelectric conversion column. Each of the photoelectric conversion elements constituting one photoelectric conversion row is shifted by about a half pitch along the row direction relative to the photoelectric conversion elements constituting another photoelectric conversion row adjacent along the column direction to the one photoelectric conversion row.

In order to transfer signal charges accumulated in each photoelectric conversion element 7, a vertical charge transfer channel 21 is formed adjacent to each photoelectric conversion column. The vertical charge transfer channel 21 extends in the column direction in a zigzag way between adjacent photoelectric conversion element columns along the row direction. For example, the vertical charge transfer channel 21 is made of an n-type semiconductor layer formed on the semiconductor substrate 6.

A plurality of first vertical charge transfer electrodes 27a and a plurality of adjacent second vertical charge transfer electrodes 27b extending in the row direction in a zigzag way are formed above the vertical charge transfer channels 21. The first and second vertical charge transfer electrodes 27a and 27b are formed line symmetrically relative to the row direction. A number of pairs of the first and second vertical charge transfer electrodes 27a and 27b are formed along the column direction. Each photoelectric conversion element 7 is positioned in each of the spaces of generally a hexagon formed between the vertical charge transfer electrodes 27a and 27b and between the electrodes 27b and 27a.

A number of photoelectric conversion elements 7 and a plurality of charge transfer electrodes are formed in a honeycomb shape so that the pixel density can be increased.

The vertical charge transfer channel 21 extends downward from the photoelectric conversion element column. A horizontal charge transfer channel 53 is connected to the lower ends of the vertical charge transfer channels 21. Charge transfer electrodes 32-1 to 32-5 are formed at positions protruding from the photoelectric conversion element columns. The charge transfer electrodes 32-4 and 32-5 are connected in common. In a semiconductor layer under the charge transfer electrode 32-4, a first barrier layer B1 (hatched in FIG. 3) is formed by a low impurity concentration n-type or p-type semiconductor layer.

The horizontal charge transfer channel 53 is formed below the most downstream horizontal charge transfer electrode 32-5. An output amplifier 61 is connected to one end of the horizontal charge transfer channel 53. The horizontal charge transfer channel 53 is made of high impurity concentration n-type semiconductor layers 53a and low impurity concentration n-type semiconductor layers 53b. Each high impurity concentration n-type semiconductor layer 53a faces one end of a corresponding vertical charge transfer channel 21. Each low impurity concentration n-type semiconductor layer 53b surrounds the upper and side edges of a corresponding high impurity concentration n-type semiconductor layer 53a.

The low impurity concentration n-type semiconductor layer 53b forms a second barrier layer B2 (hatched in FIG. 3). In place of the low impurity concentration n-type semiconductor layer, a p-type semiconductor layer may be used.

Island-shaped first horizontal charge transfer electrodes 55a formed on the high impurity concentration n-type semiconductor layers 53a and island-shaped second horizontal charge transfer electrodes 55b formed on the low impurity concentration n-type semiconductor layers 53b are alternately disposed in the horizontal direction. Each electrode is represented by 55a–i and 55b–i.

Adjacent first and second horizontal charge transfer electrodes 55a and 55b form one set constituting an electrode group capable of two-phase drive. In the example shown in FIG. 3, voltages of φH1 to φH8 are applied in the order starting from the left side as viewed in FIG. 3.

FIGS. 4A to 4C are cross sectional views taken along line IV—IV in FIG. 3. FIG. 4C is a cross sectional view of a color image pickup device. Manufacture processes up to FIG. 4C will be described with reference to FIGS. 4A and 4B.

As shown in FIG. 4A, a p-type semiconductor layer 15 is formed on a semiconductor substrate 6 by ion implantation or the like. In the p-type semiconductor layer 15, an n-type semiconductor layer 17 is formed by ion implantation or the like, the n-type semiconductor layer 17 and p-type semiconductor layer 15 forming a photoelectric conversion element (photodiode) 7. A vertical charge transfer channel 21 of n-type semiconductor is formed adjacent to the n-type semiconductor layer 17 by ion implantation or the like. Between the vertical charge transfer channel 21 and n-type semiconductor layer 17, a p-type read gate 7a is left. Channel stopper layers 23 of high impurity concentration p-type semiconductor are formed outside of the n-type semiconductor layer 17 and vertical charge transfer channel 21 by ion implantation or the like.

A gate oxide film 25a is formed on the p-type semiconductor layer 15 by thermal oxidation or the like. Charge transfer electrodes 27a ad 27b are formed on the gate oxide film 25a, traversing the vertical charge transfer channel 21. The charge transfer electrodes 27a and 27b are made of a polysilicon layer formed by chemical vapor deposition (CVD). An insulating film 25b is formed on the charge transfer electrodes 27a and 27b. A light shielding film 31 is formed on the gate oxide film 25a and insulating film 25b, the light shielding film 31 having an opening exposing a light receiving area. This structure is covered with a planarized film 30.

As shown in FIG. 4B, color filters 33 are formed on the planarized film 30 in areas corresponding to respective photoelectric conversion elements 7. In the example shown in FIG. 4B, green (G) color filters 35 are formed on both sides of the blue color filter 33. For example, the layout of color filters includes three colors, green G, blue B and red R as shown in FIG. 3.

A column of green G color filters and a column of alternately disposed red R and blue B color filters are alternately disposed in the row direction, constituting a Bayer layout. The layout of color filters is not limited only to that shown in FIG. 3, but a variety of filter layouts may be adopted.

Manufacture processes for color filters will be described. Pigment of each of R, G and B colors is mixed with transparent resin to form color resist of each of R, G and B colors.

After the planarized film 30 is formed, a first color resist layer is coated and patterned to form a first color filer. Next, second and third color filters are formed.

The color resist layer is coated with a spin coater, a spray coater, a roll coater or the like. A thickness of the color resist layer is, for example, in a range from 0.2 μm to 5 μm, and preferably in a range from 1 μm to 2 μm.

In an exposure process for forming a pattern, i line, h line, g line or excimer laser is applied to the substrate in contact with an exposure mask or not in contact. In a development process, the substrate after exposure is immersed in alkali-based development liquid, such as aqueous solution which contains sodium carbonate or sodium hydroxide, or organic solvent such as dimethylbenzylamine and triethanolamine. Aqueous solution or organic solvent may be sprayed with a spray. Antifoamer or surfactant may be added to development liquid.

The order of forming color filters of green G, red R and blue B may be any order.

As shown in FIG. 4C, a planarizing film 40 is formed on the color filters 33, 35 and 37 to planarize the irregular surface formed by the color filters. A micro lens 41 for converging light into the opening 18 of the photoelectric conversion element 7 is formed on the planarizing film 40 in an area corresponding to the element 7.

With these manufacture processes, a honeycomb CCD color image pickup device with RGB primary color filters is completed.

With referent to FIGS. 3 and 4C, the operation of the honeycomb CCD color image pickup device will be described.

The selected first and second vertical charge transfer electrodes 27a and 27b are applied with read pulses. The read pulses are not applied to the next row first and second vertical charge transfer electrodes 27a and 27b. Namely, half thinning read is performed.

When the read pulse is applied to the first vertical charge electrode 27a, green G charges are transferred from each photoelectric conversion element 7 to the vertical charge transfer channel 21 via the read gate 7a. When the read pulse is applied to the second vertical charge electrode 27b, red R and blue B charges are transferred from respective photoelectric conversion elements 7 to the vertical charge transfer channels 21 via the read gates 7a.

Voltage is sequentially applied to the first and second vertical charge transfer electrodes 27a and 27b so that charges in the vertical charge transfer channels 21 are transferred toward the horizontal charge transfer channel 53. High voltage is sequentially applied to the charge transfer electrodes 32-1, 32-2, 32-3, and 32-4 (connected to 32-5) so that charges are transferred toward the horizontal charge transfer channel 53. For example, G, B and R charges are accumulated under the charge transfer electrode 32-5. The charges once accumulated under the charge transfer electrode 32-5 will not be returned back because there is the first barrier layer B1 formed under the charge transfer electrode 32-4.

For example, when φ4 is set to a low level and φH5 is set to a high level, B or R charges accumulated under the charge transfer electrode 32-5 are transferred to the high impurity concentration n-type semiconductor layer 53a under the horizontal charge transfer electrode 55a-5. Next, when φH4 is set to the high level while φ4 is remained at the low level, the charges are transferred to the next high impurity concentration n-type semiconductor layer 53a under the electrode 55a-4. In this manner, B or R charges are transferred to the high impurity concentration n-type semiconductor layer 53a under the horizontal charge transfer electrode 55a-2.

When φH1 is set to the high level while φ4 is maintained at the low level, B or R charges transferred to the high impurity concentration n-type semiconductor layer 53a under the horizontal charge transfer electrode 55a-2 and B and R charges accumulated in the vertical charge transfer channel 21 under the charge transfer electrode 32-5 facing the horizontal charge transfer electrode 55a-1 are transferred to the high impurity concentration n-type semiconductor layer 53a under the electrode 55a-1 whereat B or R charges are added to the B and R charges. By repeating similar operations, G charges are also added to the B and R charges. Since charges of respective colors can be added, a brighter image can be obtained.

As shown in FIG. 3, the solid state image pickup device of the embodiment has a valid pixel area corresponding to a central area among a number of photoelectric conversion elements and an invalid pixel area corresponding to an outer peripheral area of the valid pixel area, e.g., an area outside of a broken line DL shown in FIG. 3. The valid pixel area has photoelectric conversion elements directly contributing to color image formation. The invalid pixel area has no function of forming a color image.

The invalid pixel area has long red (LR) monitoring photoelectric conversion elements 7i each having an LR color filter. The LR color filter has a sensitivity in the wavelength range on the longer wavelength side than the photoelectric conversion element 7r having a R color filter.

Blue, red and green photoelectric conversion elements 7b, 7r and 7g are disposed adjacent to the long red monitoring photoelectric conversion element 7i. These elements 7i, 7r, 7g and 7b are preferably disposed adjacent to each other as shown in FIG. 3. Similar to a general digital camera, while the shutter is half-depressed, signal charges are read from the long red monitoring photoelectric conversion element 7i and adjacent blue, red and green photoelectric conversion elements 7b, 7r and 7g, and the intensity of an LR signal is calculated from an output signal of the output amplifier. In this manner, the long red monitoring function can be realized. After a presence/absence of long red light is detected and the kind of an illuminating light source is identified, the AWB process is performed correctly so that an image of a good quality can be taken upon a full depression of the shutter.

If the long red monitoring photoelectric conversion element 7i is disposed at a predetermined distance or more spaced apart from the photoelectric conversion elements 7b, 7r and 7g having normal spectral sensitivities, it is not preferable in that output signal values correspond to objects having a small correlation.

Long red monitoring photoelectric conversion elements may be formed in the valid pixel area. In this case, they are not concentrated in a particular area, but preferably dispersed in a broad area. Output signals from these elements are used only for identifying the kind of an illuminating light source and not used for image formation. These elements are regarded as defective elements for image formation. It is preferable to form an image by using pixel data interpolated from adjacent normal pixel data. In this embodiment, the material of G color filters is formed by mixing Ye (yellow) pigment an G (green) pigment with transparent resin. Various pigments can be used as Ye pigment. PY (Pigment Yellow) 83, PY 129, PY 138, PY 139, PY 150 and PY 185 are particularly suitable. One of these pigments may by used or two or more of these pigments may be mixed. A solid solution of two or more pigments may be used. PG (Pigment Green) 36 and PG 7 are suitable for G pigment.

Pigment for the B color filter is formed by mixing and dispersing PV (Pigment Violet) 23, PB 15:6 and aluminum phthalocyanine pigment into transparent resin. Pigment for the R color filter is mainly red pigment.

Pigment for the LR filter is a mixture of PV 23 and PR (Pigment Red) 254 and/or PY pigment.

Charges accumulated in the photoelectric conversion elements 7b, 7g and 7r and long red monitoring photoelectric conversion element 7i are read to monitor long red light. Signal charges read from the photoelectric conversion elements are transferred to the output amplifier 61 via the vertical charge transfer channels 21 and horizontal charge transfer channel 53. It is possible to detect from the value of a signal amplified by the output amplifier 61 the presence/absence or amplitude of long red light components of an illuminating light source.

The principle of detecting long red light components with the long red monitoring photoelectric conversion element 7i will be described in detail.

As shown in FIG. 5, a general infrared cut filer (IR cut filter) almost completely transmits light having a wavelength in the range from 400 nm to 640 nm, whereas it almost completely shuts light having a wavelength of 700 nm or longer. The transmission factor gradually lowers in the wavelength range from 640 nm to 700 nm.

The lower limit of a transmission factor of the IR cut filter at a wavelength of 640 nm is preferably 10% or higher or more preferably 20% or higher. The upper limit of a transmission factor at this wavelength is approximately in a range from 95 to 100%. The lower limit of a transmission factor of the IR cut filter at a wavelength of 680 nm is preferably 1% or higher or more preferably 2% or higher. Although the upper limit of a transmission factor at this wavelength can be set to near 100% if the IR cut filter is an interference filter, it is about in a range from 4 to 10% if the IR cut filter is an optical filter.

Light in the hatched wavelength range R1 from 650 nm to 690 nm can transmit through both the IR cut filer having the above-described cut characteristics and the LR pass filter having a small transmission factor of light having a wavelength of 640 nm or shorter and a larger transmission factor on the longer wavelength side than 640 nm.

Figure 6:
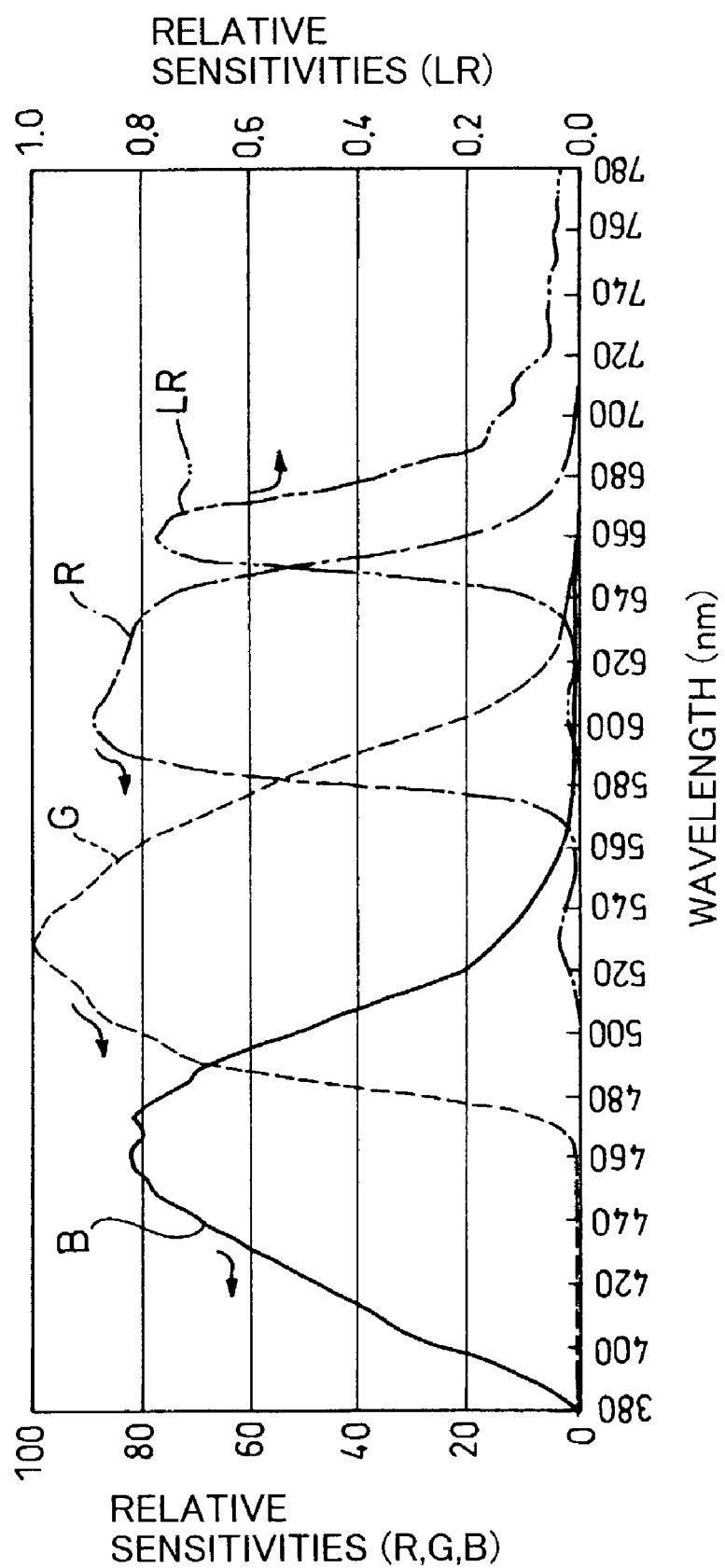
FIG. 6 is a graph showing spectral sensitivities of the solid state image pickup apparatus (digital camera) of the first embodiment.

FIG. 6 is a graph showing a wavelength dependency of a relative sensitivity of a digital camera using RGB photoelectric conversion elements and LR monitoring photoelectric conversion elements. The relative sensitivity is normalized by setting the G maximum sensitivity to 100. The left ordinate represents RGB relative sensitivities, the right ordinate represents the LR relative sensitivity, and the abscissa represents a wavelength. The LR relative sensitivity is as low as about one hundredth of the RGB relative sensitivities. The LR relative sensitivity has its peak at 660 nm and its main sensitivity in a range from 640 nm to 700 nm.

Figure 7:
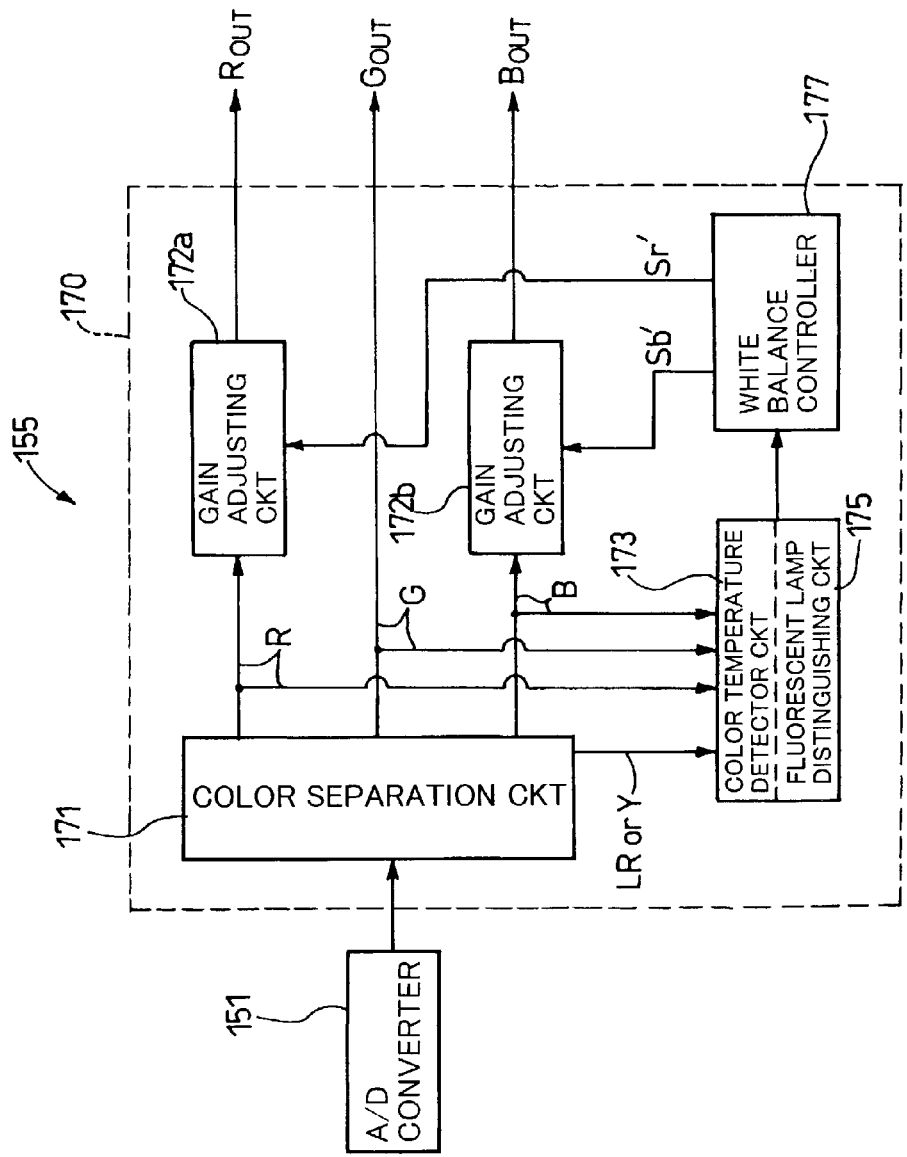
FIG. 7 is a functional block diagram showing the details of a signal processing circuit of the solid state image pickup apparatus (digital camera) of the first embodiment.

As shown in FIG. 7, the image signal processor 155 shown in FIG. 2 includes an auto white balance controller 170. This controller 170 has a color separation circuit 171, gain adjusting circuits 172a and 172b, a color temperature detector circuit 173, a fluorescent lamp distinguishing circuit 175 and a white balance control circuit 177.

The color separation circuit 171 receives digital signals output from the A/D converter 151 and separates them into R, G, B and LR (or Y to be described later) digital color signals. Of the signals output from the color separation circuit 171, for example, R and B signals are input to the gain control circuits 172a and 172b, respectively.

The R, G, B and LR (or Y) color signals output from the color separation circuit 171 are input to the color temperature detector circuit 173 and fluorescent lamp distinguishing circuit 175.

The color temperature detector circuit 173 distinguishes between color temperatures of sun light, tungsten lamp light and the like in accordance with distributions of R/G and B/G. The color temperature detector circuit 173 also judges the color hues of daylight fluorescent light, neutral white fluorescent light, bulb type fluorescent light and the like.

The fluorescent lamp distinguishing circuit 175 identifies the kind of an illuminating light source by calculating, for example, a ratio of LR/G, i.e., judges whether the illuminating light source is fluorescent light, sun light, or incandescent light. After the illuminating light source kind is identified, a signal representative of the light source kind is input to the white balance control circuit 177. This circuit 177 calculates white balance adjusting signals Sb' and Sr' which are supplied to the gain adjusting circuits 172a and 172b. Using the adjusting signals Sb' and Sr', the gain adjusting circuits 172a and 172b output color signals $B_{out}$ and $R_{out}$.

Figure 8:
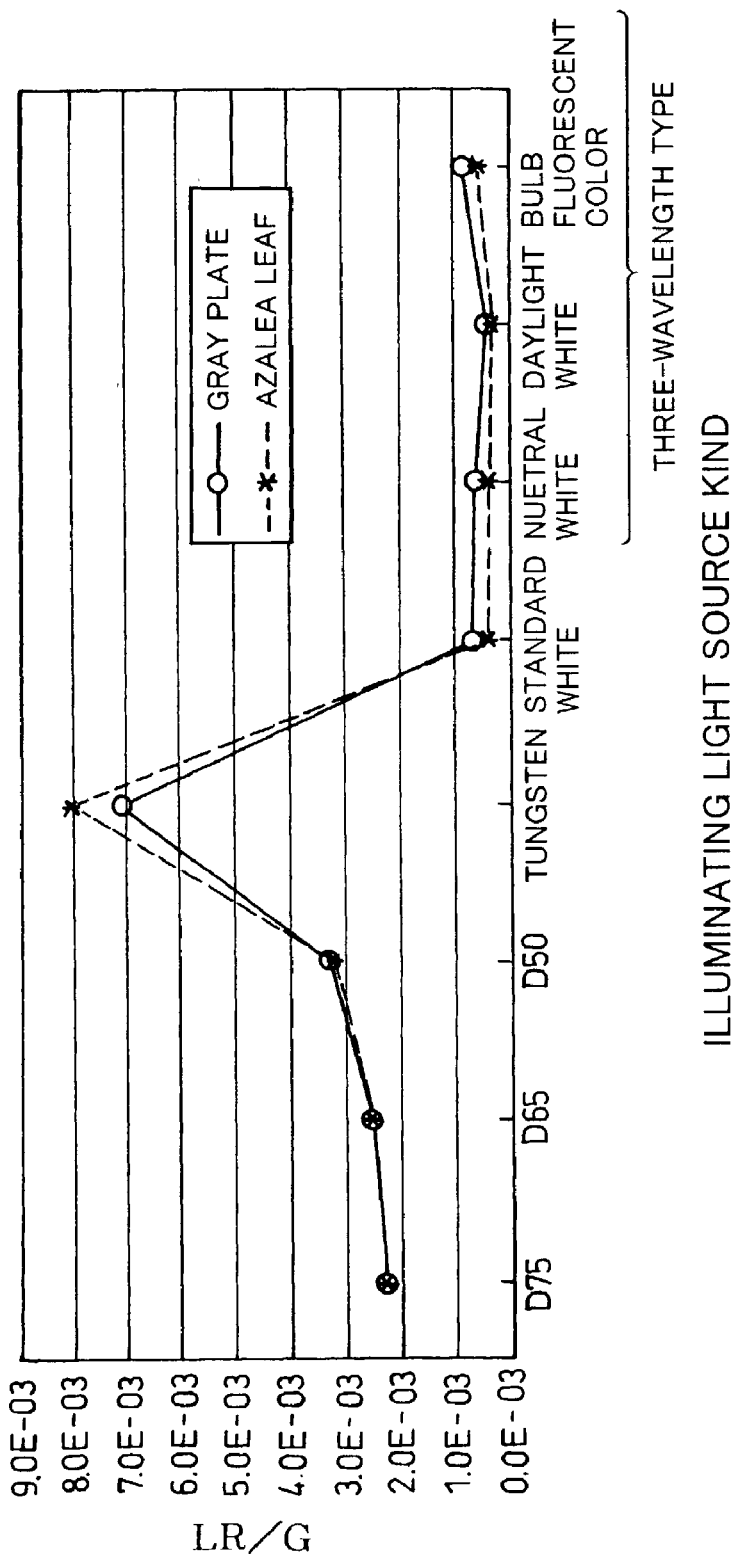
FIG. 8 is a graph showing LR/G values when a gray plate and an azalea leaf are taken under various illuminating light sources with the solid image pickup apparatus (digital camera) of the first embodiment.
Figure 9:
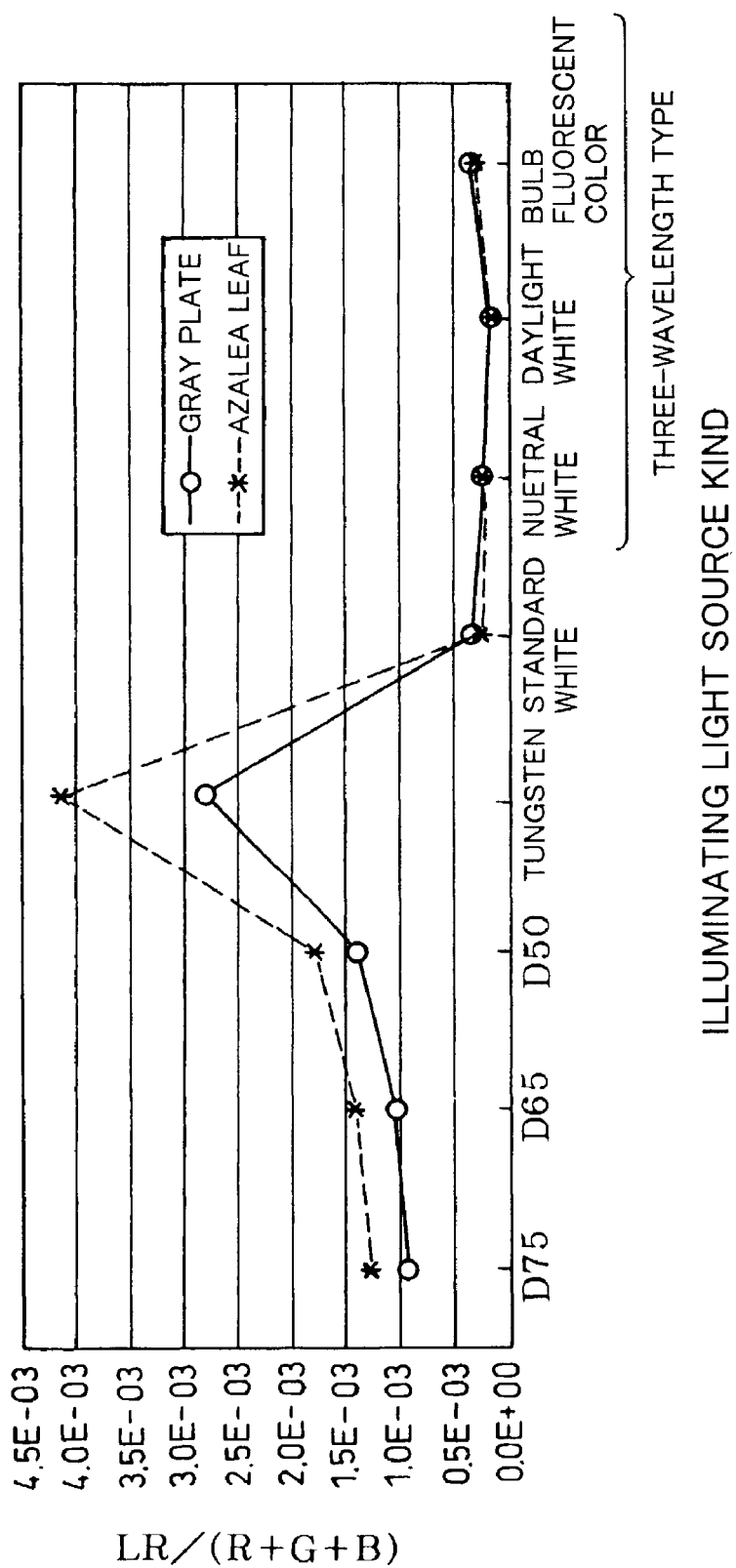
FIG. 9 is a graph showing LR/(R+G+B) values when a gray plate and an azalea leaf are taken under various illuminating light sources with the solid image pickup apparatus (digital camera) of the first embodiment.

R, G, B and LR signal values were obtained by photographing images of a gray plate (gray) and an azalea leaf (leaf green) under various light sources with a digital camera equipped with the long red monitoring photoelectric conversion elements having the spectral sensitivity characteristics shown in FIG. 6 and the white balance controller 170 (florescent lamp distinguishing circuit and white balance control circuit) shown in FIG. 7 and with a digital camera without the long red monitoring photoelectric conversion elements and the fluorescent lamp distinguishing circuit 175. FIG. 8 is a graph plotted with LR/G values, and FIG. 9 is a graph plotted with LR/(R+G+B) values. The abscissa represents a light source kind and the ordinate represents an LR/G value or an LR/(R+G+B).

As seen from FIG. 8, fluorescent lamps (standard white, neutral white, daylight color, and bulb type fluorescent color) show a small LR/G value of $1 \times 10^{-3}$ or smaller. This is because fluorescent lamps do not have a radiation energy intensity in the LR wavelength region. Tungsten light (incandescent lamp) and sun light (D50, D65, D75) having a radiation energy intensity in the LR wavelength range show a large LR/G value of $2 \times 10^{-3}$ or larger. It is therefore possible to distinguish between fluorescent light and incandescent light or sun light. A correct white balance matching the illuminating light source can be made so that the color of an image can be adjusted after it is taken.

As shown in the graph of FIG. 9 plotting LR/(R+G+B) values, fluorescent lamps show a small value of $0.5 \times 10^{-3}$ or smaller. Similar to the case shown in FIG. 8, it is possible to distinguish between fluorescent light and incandescent light or sun light.

Figure 10:
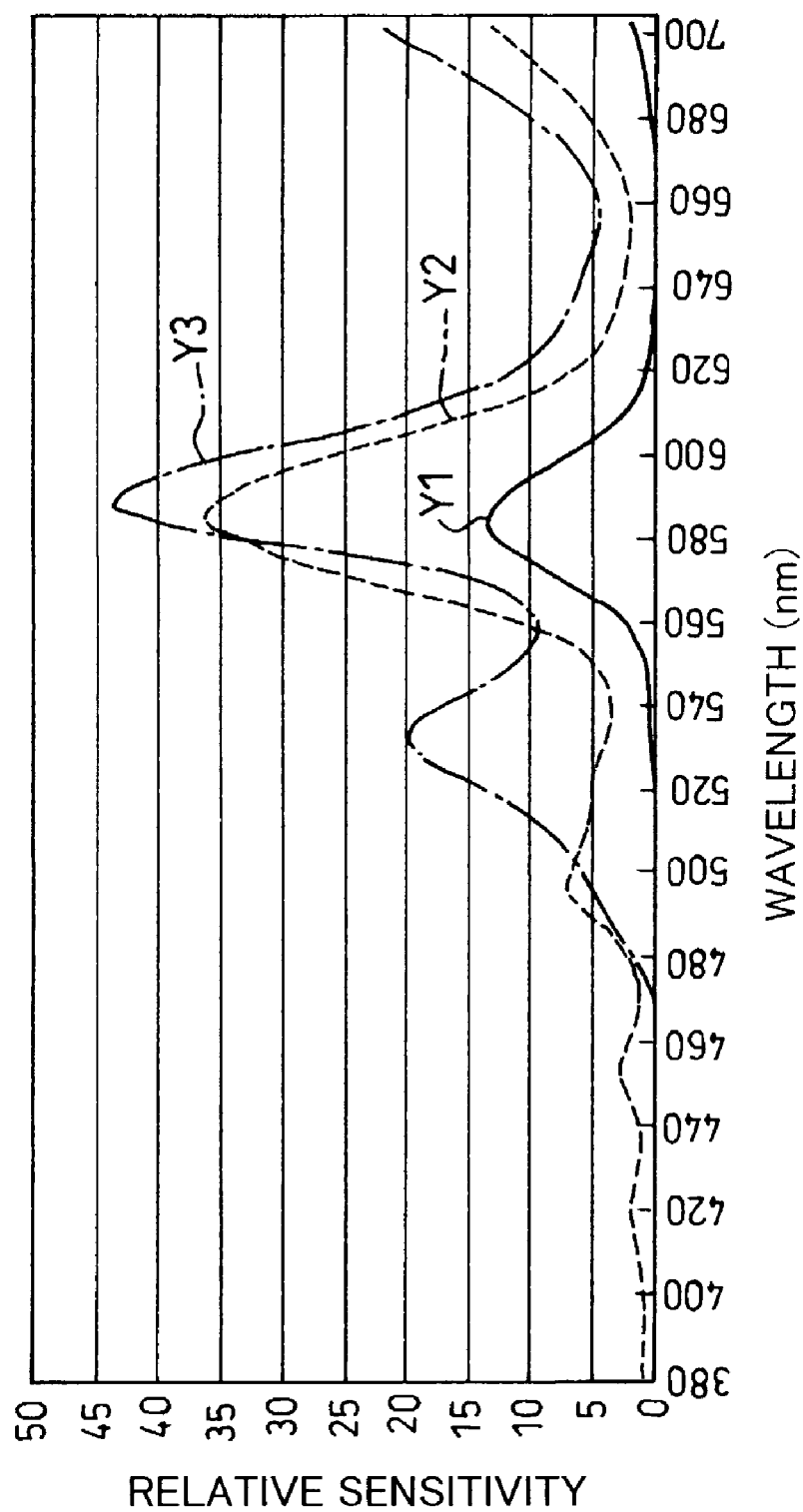
FIG. 10 is a graph showing spectral sensitivities of pixels with various yellow color filters of a solid image pickup device according to a second embodiment of the invention.
Figure 11:
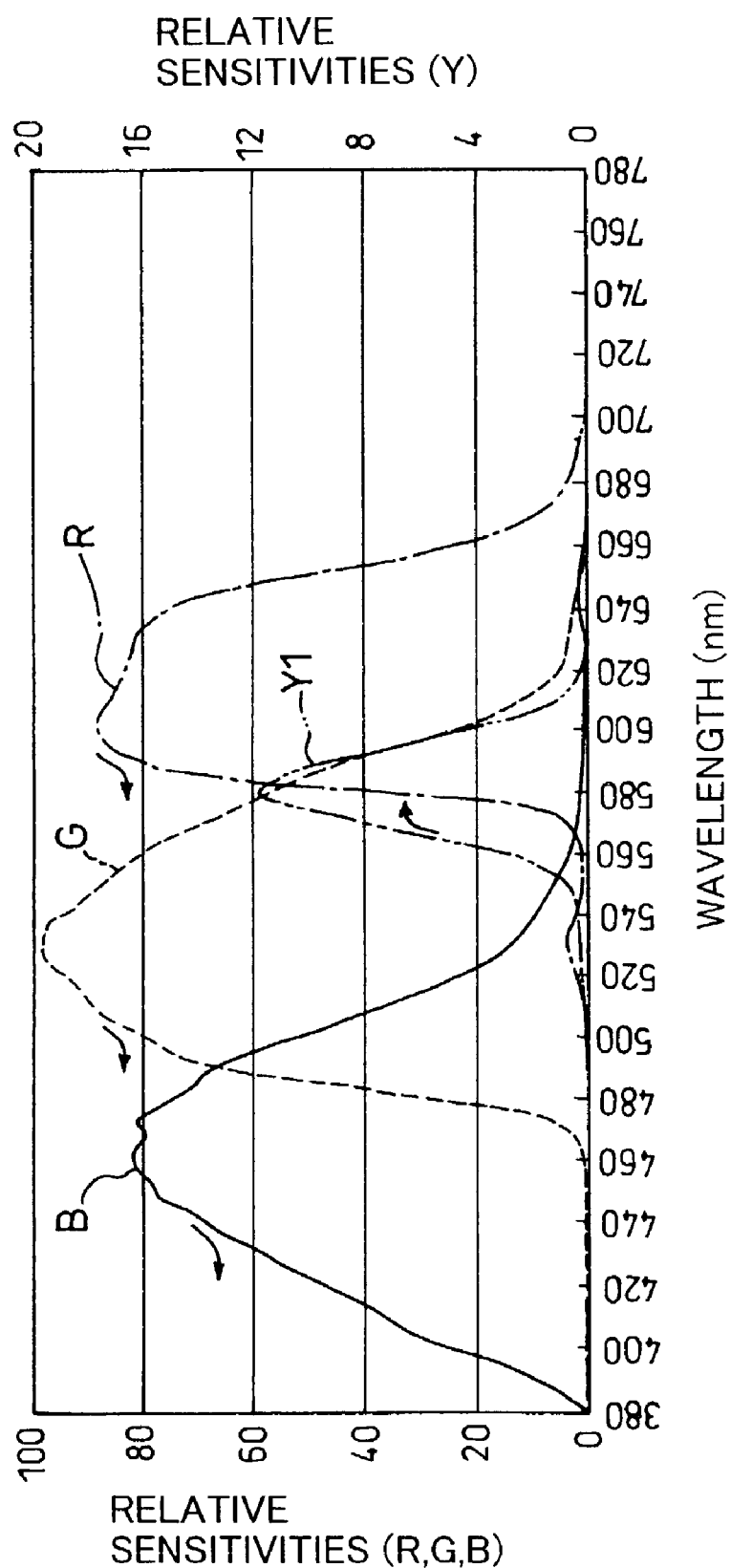
FIG. 11 is a graph showing spectral sensitivities of the solid image pickup device of the second embodiment.
Figure 12:
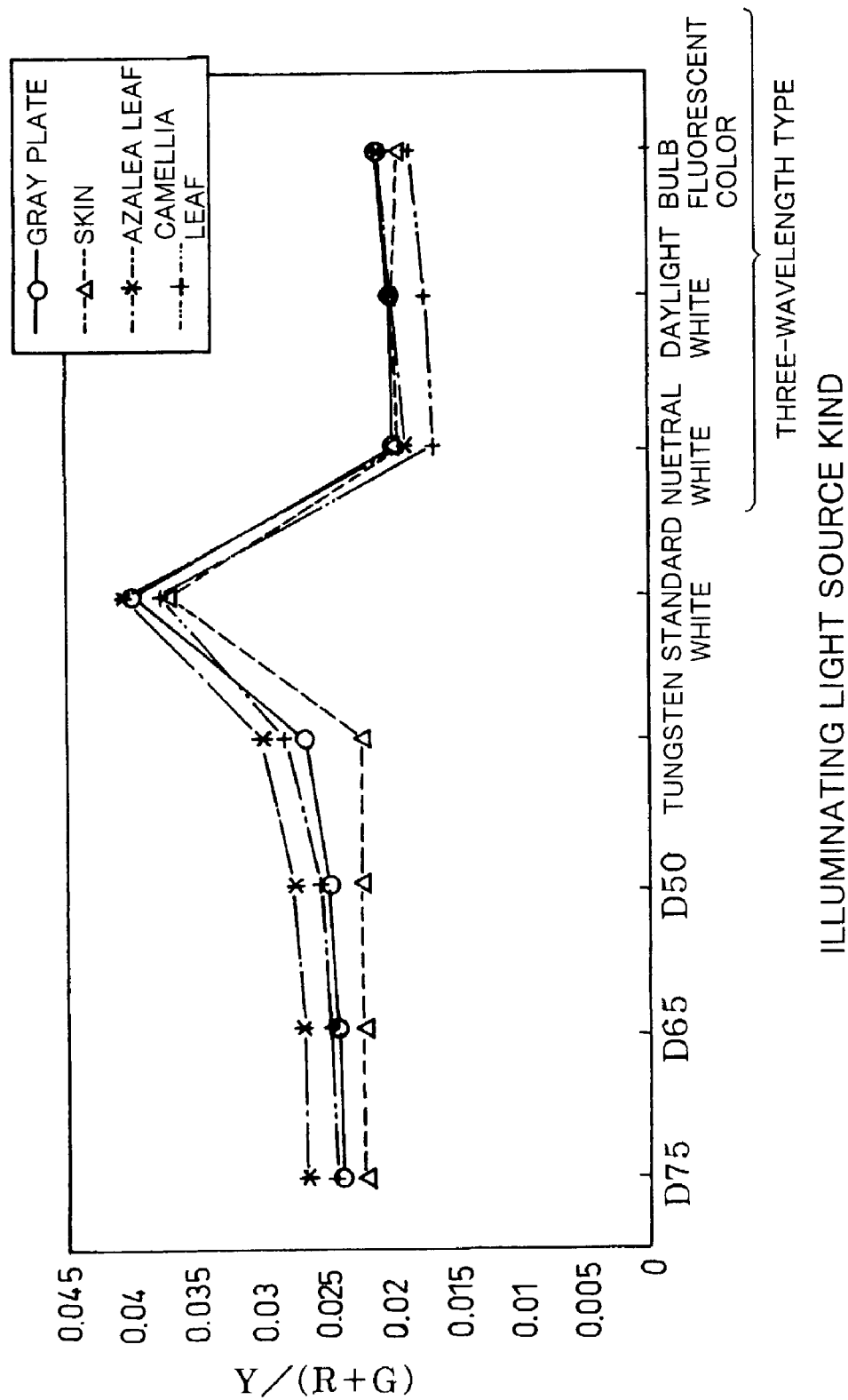
FIG. 12 is a graph showing Y/(R+G) values when a gray plate and an azalea leaf are taken under various illuminating light sources with the solid image pickup apparatus (digital camera) of the second embodiment.

Next, a color image pickup apparatus according to the second embodiment of the invention will be described with reference to FIG. 1 and FIGS. 10 to 12. FIG. 10 is a spectrum diagram showing relative spectral sensitivities of F6 detecting photoelectric conversion elements of a solid state image pickup apparatus using yellow filters. FIG. 11 is a spectrum diagram showing relative spectral sensitivities of F6 detecting photoelectric conversion elements and RGB photoelectric conversion elements. FIG. 12 is a graph showing Y/(R+G) values (ratios of an output of a photoelectric conversion element with an Y filter to a sum of outputs of photoelectric conversion elements with R and G filters) under various illuminating light sources.

As shown in FIG. 1, the standard white fluorescent lamp (F6) among the fluorescent lamps has a small radiation energy in the red wavelength range, and color distortion is likely occur even if AWB is correctly performed by a camera. A human skin (flesh) color becomes yellowish green. In the case of F6, white balance is desired to be adjusted in such a manner that a flesh color balance becomes good. It is preferable that the white balance is adjusted to the magenta side only under F6. It is therefore necessary to precisely distinguish F6 from other fluorescent lamps. Instead of adjusting the white balance for skin color under F6, a color difference matrix optimized for F6 may be used. With this matrix, the gray balance is not shifted so that color reproductivity of gray and other colors becomes good. It is important therefore to precisely distinguish F6.

F6 has a radiation energy peak at a wavelength of 580 nm. Three-wavelength fluorescent lamps (F10, F12, etc) have a relatively small radiation energy in the wavelength range near at 580 nm.

Photoelectric conversion elements having a relative sensitivity in the wavelength range near at 580 nm, e.g., from 555 nm to 605 nm, are therefore used. A color filter passing light only in this wavelength range can be made of, for example, transparent resin dispersed with mixture of three pigments of PG 36, PY 139 and PR 81. Each pigment may be dispersed singularly to mix three pigments.

A combination of pigments is not limited only thereto. For example, cyan pigment (aluminum phthalocyanine) may be used in place of PG 36, or both cyan pigment and PB 36 may be used. In place of PY 139, one of yellow pigments usable as the green color filter may be used. Yellow pigment may not be used. Magenta pigment or orange pigment may be used in place of red pigment.

FIG. 10 shows relative sensitivities Y1, Y2 and Y3 of solid state image pickup devices. For the solid state image pickup device having the relative sensitivity Y1, a color filter resist film of three mixed pigments PG 36, PY 139 and PR 81 is coated on a photoelectric conversion element. For the device having the relative sensitivity Y2, the same color filter resist film is coated thinly. For the device having the relative sensitivity Y3, an R color filter and a G color filter are recoated at a film thickness ratio $t_G/t_R$ of 1.0/0.5. All relative sensitivities Y1 to Y3 have similar spectrum characteristics in which a peak wavelength is near at 580 nm and a large main sensitivity exists in the wavelength range from 555 nm to 605 nm. The relative sensitivity Y2 has a leakage sensitivity in another wavelength range because of thin coating. The sensitivity Y3 has a sub-sensitivity near at a wavelength of 520 nm because of leakage sensitivities of G and R filters. The leakage sensitivity is lower than the main sensitivity so that light source distinguishment is not hindered.

If the LR, Y or YLR sensitivity has a significantly large leakage sensitivity, depending upon the leakage sensitivity and its wavelength range, an output value at the LR, Y or YLR sensitivity may be subtracted by an output value at the normal sensitivity (B, G or R sensitivity in primary colors) multiplied by a necessary coefficient.

For example, if the Y sensitivity has a leakage sensitivity in the blue wavelength range from 380 nm to 550 nm, the Y output value is subtracted by a necessary B output value. Namely, Y−a×B where a is a coefficient.

By using (Y−a×B)/(R+G) for light source distinguishment, unwanted influence of leakage sensitivity can be avoided. This method is particularly effective if leakage sensitivity cannot be suppressed by color filter manufacture processes.

FIG. 11 is a diagram showing digital camera spectral sensitivities including the yellow sensitivity Y1 (corresponding to Y1 shown in FIG. 10) and R, G and B sensitivities. In addition to the R, G and B sensitivities, the yellow sensitivity Y1 exists between the G and R sensitivities. The yellow relative sensitivity Y1 is about one tenth of the RGB relative sensitivity.

The yellow sensitivity can be changed with the transmission characteristics of a filter to be used. Even if the sensitivity is too small, there is no practical problem unless the SN ratio of an output signal becomes too small. It is sufficient if the ratio of a yellow sensitivity to a sensitivity of other color filters (G sensitivity in primary colors) is in the range from 0.001 or larger to 1 or smaller.

As seen from FIG. 11, the yellow relative sensitivity Y1 of the digital camera exists in the wavelength range where the skirts of the R and G relative sensitivities are superposed. The yellow relative sensitivity may be obtained therefore by superposing the R and G color filters (this sensitivity corresponds to Y3 shown in FIG. 10). If the R and G color filters are superposed, the number of manufacture processes for a solid image pickup device can be reduced more than color filters are newly formed.

The photographed results with a digital camera having the yellow sensitivity Y1 will be described with reference to FIGS. 11 and 1. Y1 has a peak near the wavelength of 580 nm and a large main sensitivity in the wavelength range from 555 nm to 605 nm. The three-wavelength fluorescent lamps (F10, F12, etc) have large and sharp radiation energy peaks near at wavelengths of 545 nm and 610 nm. These peak wavelengths are superposed upon the G and R relative sensitivity peaks. The three-wavelength fluorescent lamps (F10, F12, etc) have a relative sensitivity valley in the wavelength range from 560 nm to 600 nm, the sensitivity being as small as about one tenth of the radiation energy peak. By utilizing these characteristics, it is possible to distinguish the standard fluorescent lamp from the three-wavelength fluorescent lamps, i.e., to distinguish between fluorescent lamp kinds.

FIG. 12 is a graph showing Y/(R+G) values under various light sources when a gray plate, a skin, an azalea leaf and a camellia leaf are photographed as objects. After these objects are photographed, averages of outputs of R, G, B and Y are calculated. In the example shown in FIG. 12, Y/(R+G) values are shown. The Y/(R+G) value of the standard white fluorescent lamp F6 is as high as about 0.04 for all objects as compared to the values under other light sources. Sun light (D 50, D 65, D75) and incandescent light (tungsten light) take a value of about 0.025. The other fluorescent lamps (neutral white, daylight color, bulb type fluorescent color) take a value of about 0.02 or smaller. Instead of Y/(R+G), a value Y/(R+G+B) may be used.

The ratio of the Y relative sensitivity to the G and R relative sensitivities, i.e., Y/(R+G), of the three-wavelength standard white florescent lamp is smaller than the other illuminating light sources. The value Y/(R+G) of the standard white fluorescent lamp F6 is higher than the other illuminating light sources. The value Y/(R+G) of sun light and incandescent light (tungsten light) takes a middle value. By calculating the value Y/(R+G), it is possible to distinguish the standard white fluorescent lamp F6 from the three-wavelength fluorescent lamps, sun light and incandescent light.

After it is judged that the illuminating light source is the standard white fluorescent lamp F6, the white balance is adjusted so that a good skin color balance is obtained, i.e., the white balance is adjusted to the magenta side only under F6. In this manner, the human skin color is prevented from being changed to YG (yellowish green). Alternatively, not adjusting the white balance for the skin color under F6, a color difference matrix optimized to F6 may be used. In this case, since the gray balance is not shifted, color reproductivity of skin color and other colors can be made good.

Instead of the value Y/(R+G), a value Y/(R+G−K×Y) may be used, where K is a coefficient. By subtracting Y by a predetermined ratio, the illuminating light source distinguishment function can be improved. The coefficient K is a ratio of a sum of Y sensitivities contained in R and G to a sensitivity of Y. The Y sensitivity peak may be set at any wavelength between 555 nm and 605 nm. If the distinguishment between three-wavelength fluorescent light and sun light is to be emphasized, the relative sensitivity peak is preferably set in the range from 560 nm to 570 nm, whereas if distinguishment between F6 and sun light is to be emphasized, the relative sensitivity peak is preferably set in the range from 575 to 600 nm.

Figure 13:
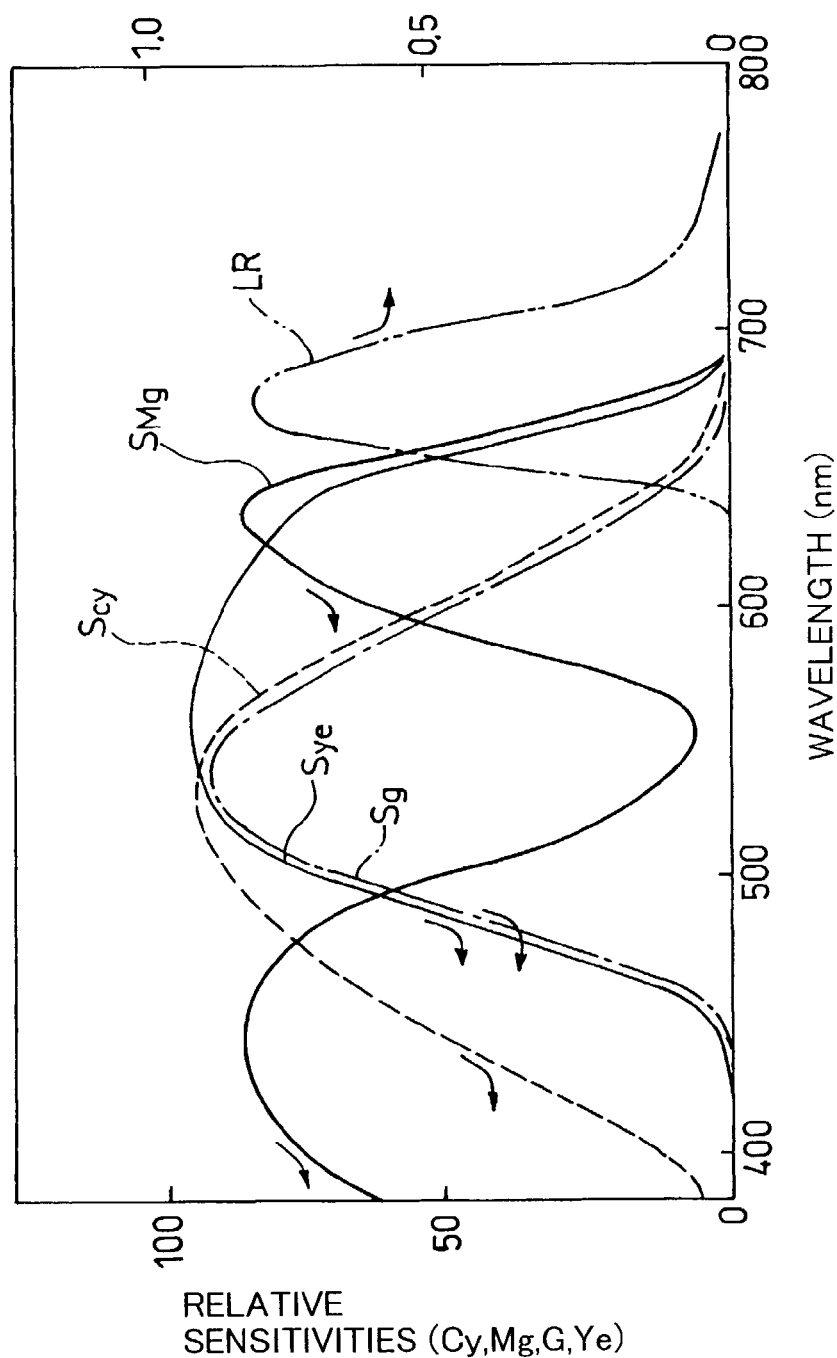
FIG. 13 is a graph showing spectral sensitivities of a solid image pickup device according to a third embodiment of the invention, when complementary color filters are used.

Next, a color image pickup apparatus according to the third embodiment of the invention will be described with reference to FIG. 13. FIG. 13 is a spectrum diagram showing relative sensitivities of a digital camera using complementary color filters. FIG. 13 shows relative sensitivities of cyan (Cy), magenta (Mg), yellow (Ye) and green (G) of a digital camera. An infrared cut filter lowers the relative sensitivity of each color and the sensitivity of the digital camera near at the wavelength of 680 nm is very small. A photoelectric conversion element with an LR filter has a relative sensitivity near at the wavelength of 680 nm. Similar to the color image pickup apparatus of the first embodiment, Cy, Mg, Ye, G and LR output signal values are obtained. For example, the value LR/G or a value LR/(Cy+Mg+Ye+G) is calculated.

The value LR/G is small under florescent light (standard white, three-wavelength neutral white, three-wavelength daylight color, and bulb type florescent color), and high under tungsten (incandescent) light including infrared light and sun light (D 50, D65, D75). It is easy for a digital camera using complementary color filters to distinguish between fluorescent light and incandescent light or sun light. The digital camera can correctly adjust the white balance matching an illumination light source so that the color of an image can be adjusted after it is taken.

The color image pickup apparatus can easily distinguish fluorescent light from sun light and incandescent light. Since the solid state image pickup device is used as an illuminating light source distinguishing monitor, the cost necessary for distinguishment can be minimized.

Figure 14:
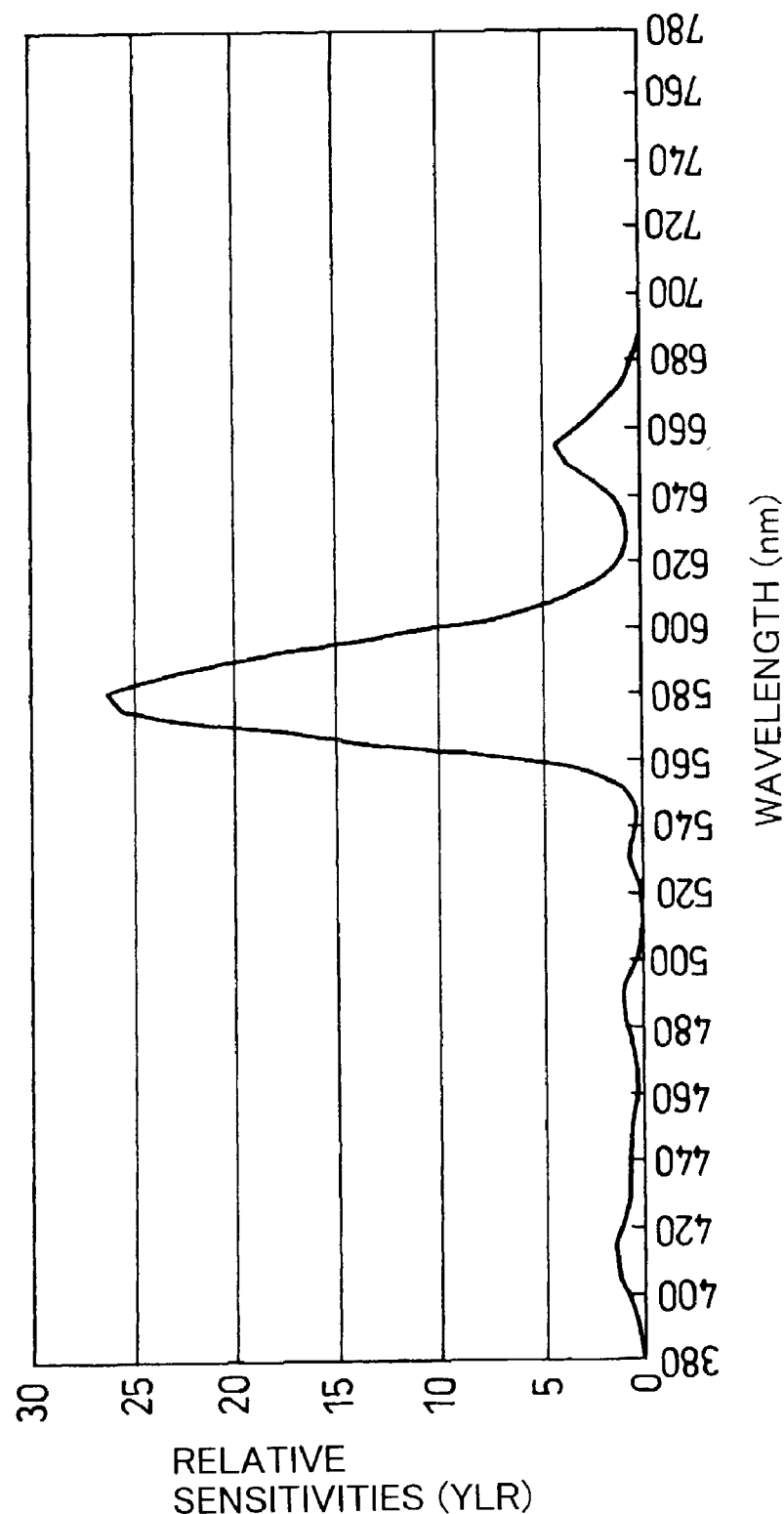
FIG. 14 is a graph showing spectral sensitivities of a solid image pickup device according to a fourth embodiment of the invention.

Next, a color image pickup apparatus according to the fourth embodiment will be described with reference to FIGS. 1, 14 and 15. FIG. 14 is a spectrum diagram showing spectral sensitivities (relative sensitivities) of an illuminating light source detecting photoelectric conversion element with an YLR filter of a solid stage image pickup device. In this specification, a filter having a high transmission factor in the yellow and long red wavelength ranges is called YLR filter. FIG. 15 a diagram showing YLR/(R+G) values of a color image pickup device under various illuminating light sources, YLR/(R+G) being a ratio of an output of a photoelectric conversion element with an YLR filter to a sum of outputs of photoelectric conversion elements with R and G filters.

In the color image pickup apparatus of the first embodiment, by using an LR filter and infrared cut filter, a filter having a transmission factor substantially only in the frequency range from 640 nm to 680 nm is formed. In this case, as described earlier, although it is easy to distinguish between the fluorescent light and the sun light or tungsten light, it is somewhat difficult to distinguish between the standard white fluorescent light F6 and the three-wavelength fluorescent light.

In the color image pickup apparatus of the second embodiment, the yellow color filter is used which has a transmission factor substantially only in the wavelength range from 555 nm to 605 nm. In this case, as described earlier, although it is easy to distinguish between the standard white fluorescent light and the three-wavelength fluorescent light, the distinguishment function between the sum light or tungsten light and the three-wavelength fluorescent light is not sufficient.

The inventor has thought of the idea that instead of an LR filter or Y filter, an YLR filter is used which has a high transmission factor in the first wavelength range from 555 nm to 605 nm and in the second wavelength range of 640 nm or longer.

As shown in FIG. 1, the radiation energy of a fluorescent lamp is very small in the long red (LR) wavelength range from 640 nm to 680 nm. Therefore, an output value of a photoelectric conversion element with an YLR filter is similar to an output value of a photoelectric conversion element with an yellow filter of the second embodiment.

Under sun light or tungsten light, an output value of a photoelectric conversion element with an YLR filter is larger than an output value of a photoelectric conversion element with a yellow color filter by an amount corresponding to LR. Therefore, YLR/(R+G) is larger than Y/(R+G) in the case of sun light and tungsten light, and smaller than Y/(R+G) in the case of three-wavelength fluorescent light.

In the case of a standard white fluorescent lamp, YLR/(R+G) is smaller than Y/(R+G) of the second embodiment. However, a distinguishment function between sun light and standard white fluorescent light is sufficient as described in the following.

Description is given for a method of forming a color filter (YLR filter) having a transmission factor in the wavelength range near at 580 nm, e.g., from 555 nm to 605 nm and in the wavelength range from 640 nm to 680 nm. A color filter having a transmission factor only in these wavelength ranges can be made of transparent resin dispersed with a mixture of three pigments, for example, magenta pigment (PR 209), cyan pigment (aluminum phthalocyanine pigment) and yellow pigment (e.g., PY 150). Each pigment may be dispersed singularly to mix three pigments.

FIG. 14 is a diagram showing the relative sensitivity of a color image pickup apparatus using a solid state image pickup device having photoelectric conversion elements with a color filter resist film made of a mixture of the above-described three pigments. As shown, the relative sensitivity has a first sensitivity spectrum having a peak at a wavelength of about 580 nm and a sensitivity in the wavelength range from 555 nm to 605 nm and a second sensitivity spectrum having a peak at a wavelength of about 660 nm and a sensitivity in the wavelength range from 620 nm to 680 nm.

The color image pickup apparatus has an RGB spectrum similar to that of the color image pickup apparatus of the second embodiment.

As shown in FIG. 14, the peak value of the second sensitivity (LR) spectrum is about 0.17 time of the peak value of the first sensitivity (Y) spectrum. It is preferable that the peak value of the second sensitivity (LR) spectrum is 0.5 time of the peak value of the first sensitivity (Y) spectrum or smaller, and more preferably 0.4 time or smaller. If the peak value of the second sensitivity (LR) spectrum is too large as compared to the peak value of the first sensitivity (Y) spectrum, the function of distinguishing between sun light, tungsten light and standard white fluorescent light becomes poor.

FIG. 15 is a graph showing YLR/(R+G) values under various light sources when a gray plate, a skin, an azalea leaf and a camellia leaf are photographed as objects. After these objects are photographed, averages of outputs of R, G, B and YLR are calculated. In the example shown in FIG. 15, YLR/(R+G) values are shown.

The YLR/(R+G) value of the standard white fluorescent lamp F6 is as high as about 0.09 for all objects as compared to the values under other light sources. Sun light (D 50, D 65, D75) and incandescent light (tungsten light) take a small value from 0.06 to 0.07. The three-wavelength fluorescent lamps (neutral white, daylight color, bulb color) take a smaller value of about 0.04. Instead of YLR/(R+G), a value YLR/(R+G+B) may be used.

The ratio of the YLR output value to a sum of G and R output values, i.e., YLR/(R+G), of the three-wavelength florescent lamp is smaller than the other illuminating light sources. The value YLR/(R+G) of the standard white fluorescent lamp F6 is higher than the other illuminating light sources. The value YLR/(R+G) of sun light and incandescent light (tungsten light) takes a middle value.

By calculating the value YLR/(R+G), it is possible to distinguish between sun light, incandescent light and fluorescent light, and to distinguish between a standard white fluorescent lamp F6 and three-wavelength fluorescent lamps. In this embodiment, the function of distinguishing three-wavelength florescent light, sun light and incandescent light (tungsten light) is better then that of the second embodiment.

By forming the YLR filter by using transparent resin which contains dye, the second sensitivity (LR) can be made higher than the first sensitivity (Y). In this case, the peak value of the second sensitivity (LR) is preferably set to two times or more of the peak value of the first sensitivity, or more preferably set to 2.5 times or more.

Even if the first sensitivity (Y) and second sensitivity (LR) are set in this manner, by calculating the value YLR/(R+kG) where k if a coefficient or the value YLR/R, it becomes possible to distinguish between sun light, incandescent light and fluorescent light, and to distinguish between a standard white fluorescent lamp F6 and three-wavelength fluorescent lamps. The value YLR/(R+kG) and value YLR/R are largest for sun light and incandescent light (tungsten light), and become smaller in the order of standard white fluorescent light F6 and three-wavelength fluorescent light.

As compared to the case wherein an LR filter of the first embodiment and a yellow filter of the second embodiment are formed on different photoelectric conversion elements, the structure of a solid state pickup device can be simplified. After it is judged that the illuminating light source is the standard white fluorescent lamp F6, similar to the second embodiment, the white balance is adjusted so that a good skin color balance is obtained, i.e., the white balance is adjusted to be near magenta only under F6. In this manner, the human skin color is prevented from being changed to YG (yellowish green). Alternatively, not adjusting the white balance for the skin color under F6, a color difference matrix optimized to F6 may be used. The optimized white balance or color difference matrix may also be applied to three-wavelength fluorescent lamps.

The present invention has been described in connection with the preferred embodiments. The invention is not limited only to the above embodiments. It is apparent that various modifications, improvements, combinations, and the like can be made by those skilled in the art.

For example, although a CCD solid state image pickup device is used in each embodiment, a CMOS solid state image pickup device may also be used to provide similar advantages.

If both the fluorescent lamp distinguishing circuits of the color image pickup apparatuses of the first and second embodiments are used, it is possible to distinguish fluorescent lamps from other illuminating light sources, and to distinguish the standard white florescent lamp from other fluorescent lamps. White balance can be set more precisely.

The invention claimed is:

1. A color image pickup apparatus comprising an optical image pickup system and a signal processing system for processing a signal supplied from said optical image pickup system, wherein:

said optical image pickup system comprises:
a plurality of photoelectric conversion elements regularly disposed on a two-dimensional plane;
a plurality of color filters each disposed on each of said photoelectric conversion elements, said color filters including first and second color filter groups, the first color filter group including visual light color filters of a plurality of colors to be used for obtaining digital color image signals, and the second color filter group including a long wavelength red color filter and at least one of the visual light color filters, the long red color filter having a transmission factor only in a wavelength range of substantially 640 nm or longer and being used for white color balance;
an infrared cut filter disposed on said color filters; and
a taking lens, and
said signal processing system comprises a control circuit including:
a fluorescent lamp distinguishing circuit for distinguishing a fluorescent lamp from other illuminating light sources in accordance with a ratio of an output signal from the photoelectric conversion elements having the long red filter of the second color filter group to an output signal from the photoelectric conversion elements having the visual light color filter; and
a first white balance control circuit for adjusting a white balance so as to match the illuminating light source distinguished by said fluorescent lamp distinguishing circuit.

2. A color image pickup apparatus according to claim 1, wherein a transmission factor of the infrared filter is 10% or higher at a wavelength of 640 nm, and 1% or higher at a wavelength of 680 nm.

3. A color image pickup apparatus according to claim 2, wherein the long red color filter is made of transparent resin dispersed with a mixture of pigments including violet pigment and at least red or yellow pigment.

4. A color image pickup apparatus according to claim 1, wherein a transmission factor of the infrared filter is 20% or higher at a wavelength of 640 nm, and 2% or higher at a wavelength of 680 nm.

5. A color image pickup apparatus comprising an optical image pickup system and a signal processing system for processing a signal supplied from said optical image pickup system, wherein:

said optical image pickup system comprises:
a plurality of photoelectric conversion elements regularly disposed on a two-dimensional plane;
a plurality of color filters each disposed on each of said photoelectric conversion elements, said color filters including first and third color filter groups, the first color filter group including visual light color filters of a plurality of colors to be used for obtaining digital color image signals, and the third second color filter group including a yellow color filter and at least one of the visual light color filters, the yellow color filter having a transmission factor only in a wavelength range substantially from 555 nm to 605 nm longer and being used for white color balance;
an infrared cut filter disposed on said color filters; and
a taking lens, and
said signal processing system comprises a control circuit including:
a fluorescent lamp distinguishing circuit for distinguishing a standard white fluorescent lamp from other illuminating light sources in accordance with a ratio of an output signal from the photoelectric conversion elements having the yellow color filter of the third color filter group to an output signal from the photoelectric conversion elements having the visual light color filter; and
a second white balance control circuit for adjusting a white balance so as to match the illuminating light source distinguished by said fluorescent lamp distinguishing circuit.

6. A color image pickup apparatus according to claim 5, wherein the yellow color filter is made of transparent resin dispersed with a mixture of pigments including at least one of green and cyan pigments and at least one of red, orange and magenta pigments.

7. A color image pickup apparatus according to claim 6, wherein yellow pigment is additionally mixed.

8. A color image pickup apparatus according to claim 7, wherein each pigment is a mixture of two or more pigments.

9. A color image pickup apparatus according to claim 5, wherein the yellow color filter is a lamination of a red filter and a green filter.

10. A color image pickup apparatus according to claim 5, wherein said optical image pickup system corresponding to the yellow color filter has a main sensitivity in a wavelength range from 560 nm to 570 nm.

11. A color image pickup apparatus according to claim 5, wherein said optical image pickup system corresponding to the yellow color filter has a main sensitivity in a wavelength range from 575 nm to 600 nm.

12. A color image pickup apparatus according to claim 5, wherein the yellow color filter includes a first color filter and a second color filter having light transmission characteristics different from the first color filter and formed in an area different from the first color filter, said optical image pickup system corresponding to the first color filter has a main sensitivity in a first wavelength range from 560 nm to 570 nm, and said optical image pickup system corresponding to the second color filter has a main sensitivity in a second wavelength range from 575 nm to 600 nm.

13. A color image pickup apparatus according to claim 12, wherein a peak value of a sensitivity in the second wavelength range is at most 40% of a peak value of a sensitivity in the first wavelength range.

14. A color image pickup apparatus comprising an optical image pickup system and a signal processing system for processing a signal supplied from said optical image pickup system, wherein:

said optical image pickup system comprises:
a plurality of photoelectric conversion elements regularly disposed on a two-dimensional plane;
a plurality of color filters each disposed on each of said photoelectric conversion elements, said color filters including first, second and third color filter groups, the first color filter group including visual light color filters of a plurality of colors to be used for obtaining digital color image signals, the second color filter group including a long red color filter and at least one of the visual light color filters, the long wavelength red color filter having a transmission factor only in a wavelength range of substantially 640 nm or longer and being used for white color balance, and the third second color filter group including a yellow color filter and at least one of the visual light color filters, the yellow color filter having a transmission factor only in a wavelength range substantially from 555 nm to 605 nm longer and being used for white color balance;

an infrared cut filter disposed on said color filters; and a taking lens, and said signal processing system comprises a control circuit including:

a fluorescent lamp distinguishing circuit for distinguishing a fluorescent lamp from other illuminating light sources in accordance with a ratio of an output signal from the photoelectric conversion elements having the long red filter of the second color filter group to an output signal from the photoelectric conversion elements having the visual light color filter;

a first white balance control circuit for adjusting a white balance so as to match the illuminating light source distinguished by said fluorescent lamp distinguishing circuit; and a second white balance control circuit for adjusting a white balance so as to match the illuminating light source distinguished by said fluorescent lamp distinguishing circuit.

15. A color image pickup apparatus comprising an optical image pickup system and a signal processing system for processing a signal supplied from said optical image pickup system, wherein:

said optical image pickup system comprises:

a plurality of photoelectric conversion elements regularly disposed on a two-dimensional plane;

a plurality of color filters each disposed on each of said photoelectric conversion elements, said color filters including first and second color filter groups, the first color filter group including visual light color filters of a plurality of colors to be used for obtaining digital color image signals, and the second color filter group including an YLR filter and at least one of the visual light color filters, the YLR filter having a transmission factor only in a first wavelength range of substantially from 555 nm to 605 nm and in a second wavelength range of 640 nm or longer and being used for white color balance;

an infrared cut filter disposed on said color filters; and a taking lens, and said signal processing system comprises a control circuit including:

a fluorescent lamp distinguishing circuit for distinguishing a fluorescent lamp from other illuminating light sources and a kind of the fluorescent lamp in accordance with a ratio of an output signal from the photoelectric conversion elements having the YLR filter of the second color filter group to an output signal from the photoelectric conversion elements having the visual light color filter; and a first white balance control circuit for adjusting a white balance so as to match the illuminating light source distinguished by said fluorescent lamp distinguishing circuit.

16. A color image pickup apparatus according to claim 15, wherein a peak value of a sensitivity in the first wavelength range is 40% of a peak value of a sensitivity in the second wavelength range or smaller.

17. A color image pickup apparatus according to claim 15, wherein the YLR filter is made of transparent resin dispersed and mixed with cyan pigment and at least one of magenta pigment, orange pigment, red pigment, and yellow pigment.

18. A color image pickup apparatus according to claim 15, wherein a peak value of a sensitivity in the first wavelength range is two times of a peak value of a sensitivity in the second wavelength range or more.

* * * * *